(12) United States Patent
Isono et al.

(10) Patent No.: US 9,730,337 B2
(45) Date of Patent: Aug. 8, 2017

(54) PLATING METHOD

(75) Inventors: Toshihisa Isono, Osaka (JP); Shinji Tachibana, Osaka (JP); Naoyuki Omura, Osaka (JP); Kanako Matsuda, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 14/122,981

(22) PCT Filed: May 22, 2012

(86) PCT No.: PCT/JP2012/003338
§ 371 (c)(1),
(2), (4) Date: Nov. 27, 2013

(87) PCT Pub. No.: WO2012/164872
PCT Pub. Date: Dec. 6, 2012

(65) Prior Publication Data
US 2014/0120245 A1 May 1, 2014

(30) Foreign Application Priority Data

May 27, 2011 (JP) .................................. 2011-118939

(51) Int. Cl.
*B05D 5/12* (2006.01)
*H05K 3/42* (2006.01)
(Continued)

(52) U.S. Cl.
CPC ........... *H05K 3/422* (2013.01); *C23C 18/161* (2013.01); *C23C 18/1628* (2013.01); *C23C 18/1669* (2013.01); *C23C 18/1675* (2013.01); *C23C 18/1683* (2013.01); *C25D 5/026* (2013.01); *C25D 17/00* (2013.01); *C25D 21/10* (2013.01); *C25D 21/12* (2013.01); *H05K 3/423* (2013.01); *B05D 1/02* (2013.01); *B05D 5/12* (2013.01);
(Continued)

(58) Field of Classification Search
USPC ... 427/97.7, 233, 236, 241, 421.1, 424, 425, 427/427.1, 427.3
See application file for complete search history.

(56) References Cited

U.S. PATENT DOCUMENTS 3,503,856 A * 3/1970 Clifford .................. C25D 5/08
204/273
3,825,164 A * 7/1974 Sarnacki .............. B23K 3/0653
118/400
(Continued)

FOREIGN PATENT DOCUMENTS

JP   05-309294   * 11/1993
JP   5-309294    11/1993
(Continued)

*Primary Examiner* — Brian K Talbot
(74) *Attorney, Agent, or Firm* — Norris McLaughlin & Marcus, P.A.

(57) ABSTRACT

The invention eliminates defects generated in a metal filling a through hole of a printed board by changing an angle at which a plating solution is sprayed or by changing a posture of the printed board at a time point in a process of precipitating the metal from the plating solution and filling the through hole with the precipitated metal while the plating solution or air bubbles are being sprayed onto the printed board.

4 Claims, 18 Drawing Sheets

(51) Int. Cl.

| | | |
|---|---|---|
| *C23C 18/16* | (2006.01) | |
| *C25D 5/02* | (2006.01) | |
| *C25D 21/10* | (2006.01) | |
| *C25D 21/12* | (2006.01) | |
| *C25D 17/00* | (2006.01) | |
| *C23C 4/12* | (2016.01) | |
| *B05D 1/02* | (2006.01) | |
| *H05K 3/12* | (2006.01) | |
| *H05K 3/10* | (2006.01) | |
| *C25D 3/38* | (2006.01) | |
| *C23C 18/38* | (2006.01) | |

(52) U.S. Cl.
CPC ............... *C23C 4/12* (2013.01); *C23C 18/38* (2013.01); *C25D 3/38* (2013.01); *H05K 3/107* (2013.01); *H05K 3/1258* (2013.01); *H05K 2201/09563* (2013.01); *H05K 2203/075* (2013.01); *H05K 2203/081* (2013.01); *H05K 2203/1518* (2013.01); *H05K 2203/1554* (2013.01); *H05K 2203/1563* (2013.01)

(56) References Cited

U.S. PATENT DOCUMENTS

| | | | | | |
|---|---|---|---|---|---|
| 4,174,261 | A | * | 11/1979 | Pellegrino | ............ 204/273 |
| 4,372,825 | A | * | 2/1983 | Eidschun | ............ C25D 5/08 204/273 |
| 4,687,554 | A | * | 8/1987 | Shyu | ............ H05K 3/241 205/148 |
| 4,734,296 | A | * | 3/1988 | Schramm | ............ C23C 18/1617 427/304 |
| 4,981,559 | A | * | 1/1991 | Sato | ............ C25D 5/08 204/237 |
| 5,077,099 | A | * | 12/1991 | Kukanskis | ............ C23C 18/163 118/425 |
| 5,480,675 | A | * | 1/1996 | Murakami | ............ C25D 21/04 118/404 |
| 5,615,828 | A | * | 4/1997 | Stoops | ............ 228/223 |
| 6,908,515 | B2 | * | 6/2005 | Schroder | ............ H05K 3/0088 134/1 |
| 2002/0056192 | A1 | * | 5/2002 | Suwa et al. | ............ 29/847 |
| 2003/0135998 | A1 | * | 7/2003 | Walz et al. | ............ 29/854 |
| 2006/0207886 | A1 | | 9/2006 | Isono et al. | |
| 2009/0056981 | A1 | * | 3/2009 | Maeda et al. | ............ 174/254 |

FOREIGN PATENT DOCUMENTS

| | | | |
|---|---|---|---|
| JP | 2000-064088 | * | 2/2000 |
| JP | 2000-244086 | * | 9/2000 |
| JP | 2000-328288 | | 11/2000 |
| JP | 2004-107721 | | 4/2004 |
| JP | 2005-146343 | | 6/2005 |
| JP | 2006-057177 | | 3/2006 |
| JP | 2010-202962 | | 9/2010 |
| TW | 377546 | * | 12/1999 |

* cited by examiner

F I G. 9
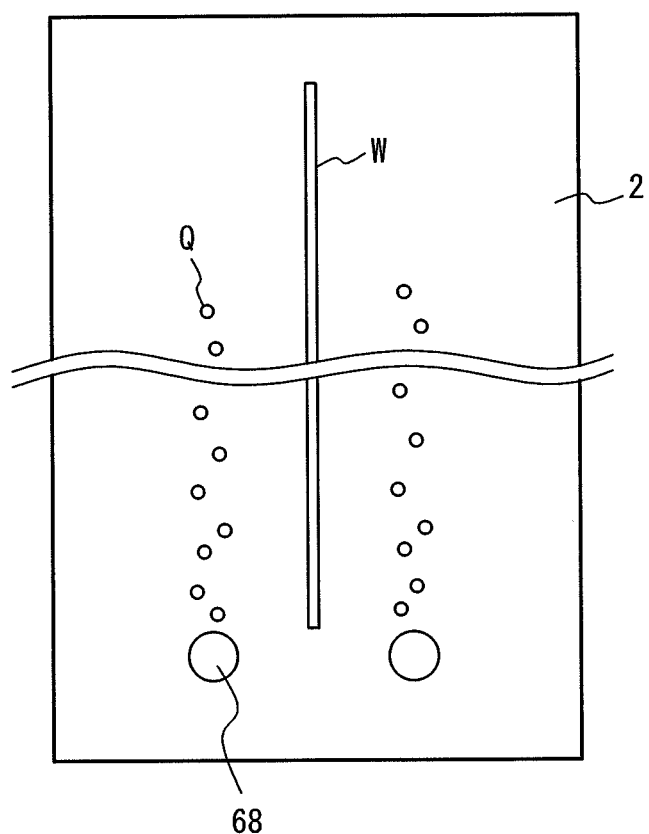

F I G. 1 5
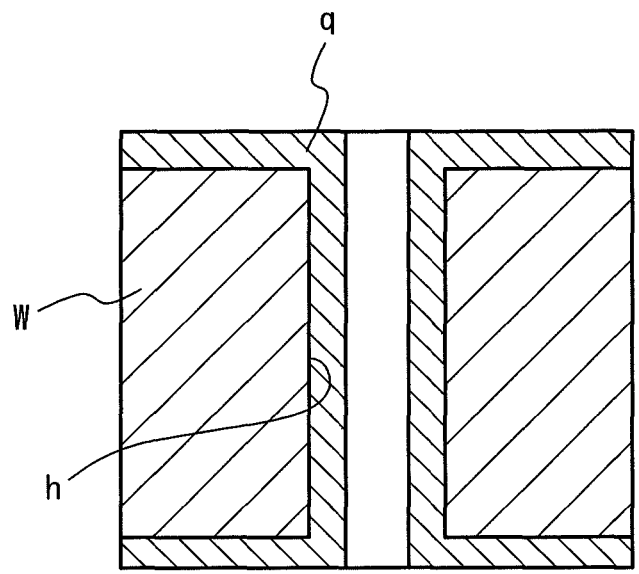

PLATING METHOD

BACKGROUND OF THE INVENTION

The invention relates to a plating method for filling a through hole of a printed board with a metal precipitated from a plating solution by electroless plating or electroplating.

Some of the multilayer printed circuit boards conventionally available have a built-up structure where a plurality of printed boards are multilayered on front and back surfaces of a core substrate. Describing steps of producing such a multilayer printed circuit board, a through hole is formed in the core substrate, an inner surface of the through hole is subjected to electroless plating or electroplating and then supplied with an electrically conductive paste, printed boards are multilayered on front and back surfaces of the core substrate, and required processes are repeatedly performed thereto. As a result of these steps, the multilayer printed circuit board is finally obtained.

In the multilayer printed circuit board thus produced, the printed boards are multilayered on the front and back surfaces of the core substrate, and the electrically conductive paste filling the through hole contains non-metallic components that lower a thermal conductivity. These factors deteriorate the heat dissipation capacity of the multilayer printed circuit board when, for example, heat is generated by electric current running through the through hole.

Conventionally, the heat dissipation capacity is often improved by filling the through hole of the core substrate with a metal by plating instead of using the electrically conductive paste as a filling material. For any through holes diametrically too small to be filled with the electrically conductive pastes, tilling such a through hole with a metal by plating is an effective solution that increases a degree of integration in the multilayer printed circuit boards.

However, filling the through hole of the core substrate with a metal by plating has the unsolved problem that voids and/or seams are easily generated in the metal used to fill the through hole. The void represents a phenomenon where air bubbles are trapped in a precipitated metal when parts of the precipitated metal separately growing from the side surface toward the axis of the through hole merge into each other near the axis. The seam represents a phenomenon where the precipitated metal merging near the axis of the through hole has some parts incompletely merged (often look like seams). These voids and seams are likely to cause breakage of wires when hit by thermal shock, possibly degrading the electric characteristics and the heat dissipation capacity of the through hole.

According to some techniques disclosed so far, the plating solution is modified as an attempt to prevent the voids and/or seams (for example, see the Patent Documents JP Patent Publication No. 2006-57177 and JP Patent Application Publication No. 2005-146343). These techniques, however, need to be refined in order to strictly control the voids and/or seams in any circumstances where the aspect ratio of the through hole is further increased.

SUMMARY OF THE INVENTION

The invention was accomplished to solve these conventional technical problems. The invention has an object to provide a plating method that succeeds in plating without the occurrence of any voids or seams when a through hole is filled with a metal precipitated from a plating solution in any circumstances where the aspect ratio of through hole is further increased.

A first plating method according to the invention is a plating method for filling a through hole of a printed board with a metal by electroless plating or electroplating. The first plating method is further characterized in that a spray angle that is non-perpendicular to the printed board is set, a plating solution is sprayed onto the printed board at the spray angle, and the spray angle of the plating solution is changed at a time point during the plating treatment.

A second plating method according to the invention is a plating method for filling a through hole of a printed board with a metal by electroless plating or electroplating. The second plating method is further characterized in that a spray angle that is non-perpendicular to the printed board is set, a plating solution is a sprayed onto the printed board at the spray angle, and the posture of the printed board is changed at a time point during the plating treatment.

A third plating method according to the invention is a plating method for filling a through hole of a printed board with a metal by electroless plating or electroplating. The third plating method is further characterized in that the printed board is dipped in a plating solution, air bubbles are sprayed onto the printed board in the plating solution, and the posture of the printed board is changed at a time point during the plating treatment.

According to the invention, the plating treatment is preferably performed while the printed board is being transported in a vertical or horizontal direction.

According to the invention, the plating solution is preferably sprayed onto front and back surfaces of the printed board in mirror-image symmetry.

According to the invention, lengths of plating time before and after changing the spray angle are preferably equal.

According to the invention, lengths of plating time before and after changing the posture of the printed board are preferably equal.

According to the invention, the plating solution is preferably a copper sulfate plating solution.

According to the invention, a through hole having an increased higher aspect ratio can be favorably filled with a metal without the occurrence of any voids or seams. The invention thus characterized achieve the following effects: forming wirings on front and back surfaces of a printed board with precision and thereby increasing a degree of integration in the printed board; filling a through hole with a metal with precision and thereby improving the heat dissipation capacity and reliability of the printed board; and completing such a precision metal filling in a shorter plating time than in the conventional methods.

BRIEF DESCRIPTION OF THE DRAWINGS

FIG. 9 is a drawing (3) illustrating another plating method according to the embodiment.

FIG. 15 is a drawing illustrating a fourth state of a through hole plated by a plating method according to a comparative example.

DETAILED DESCRIPTION OF THE INVENTION

Figure 1:
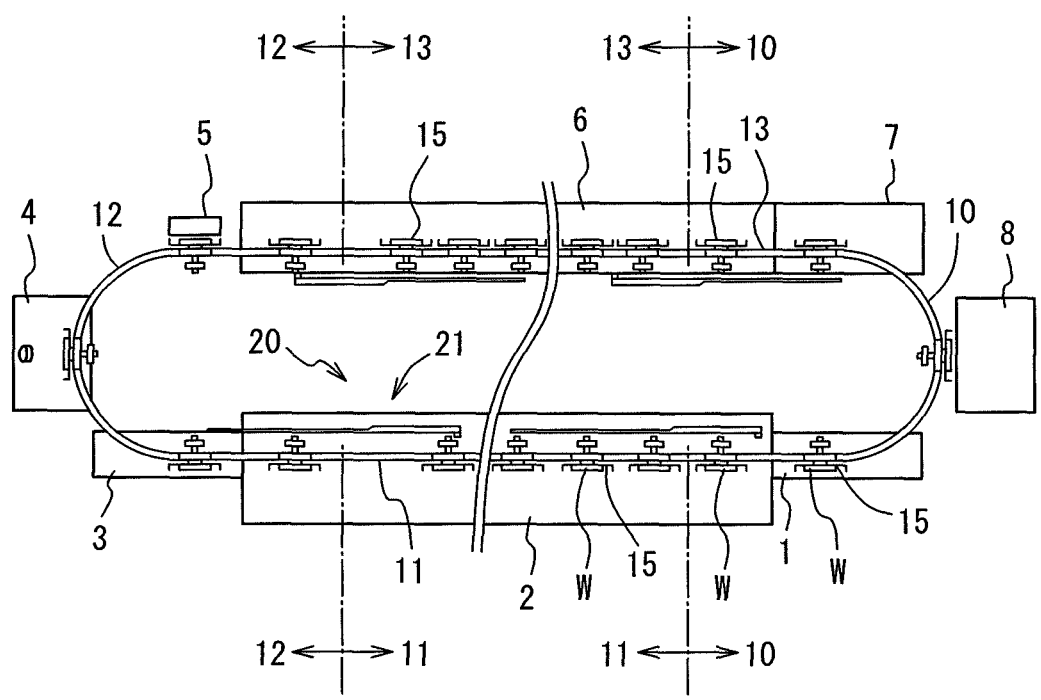
FIG. 1 is a plan view of an overall structure of a plating apparatus according to an embodiment of the invention.
Figure 2:
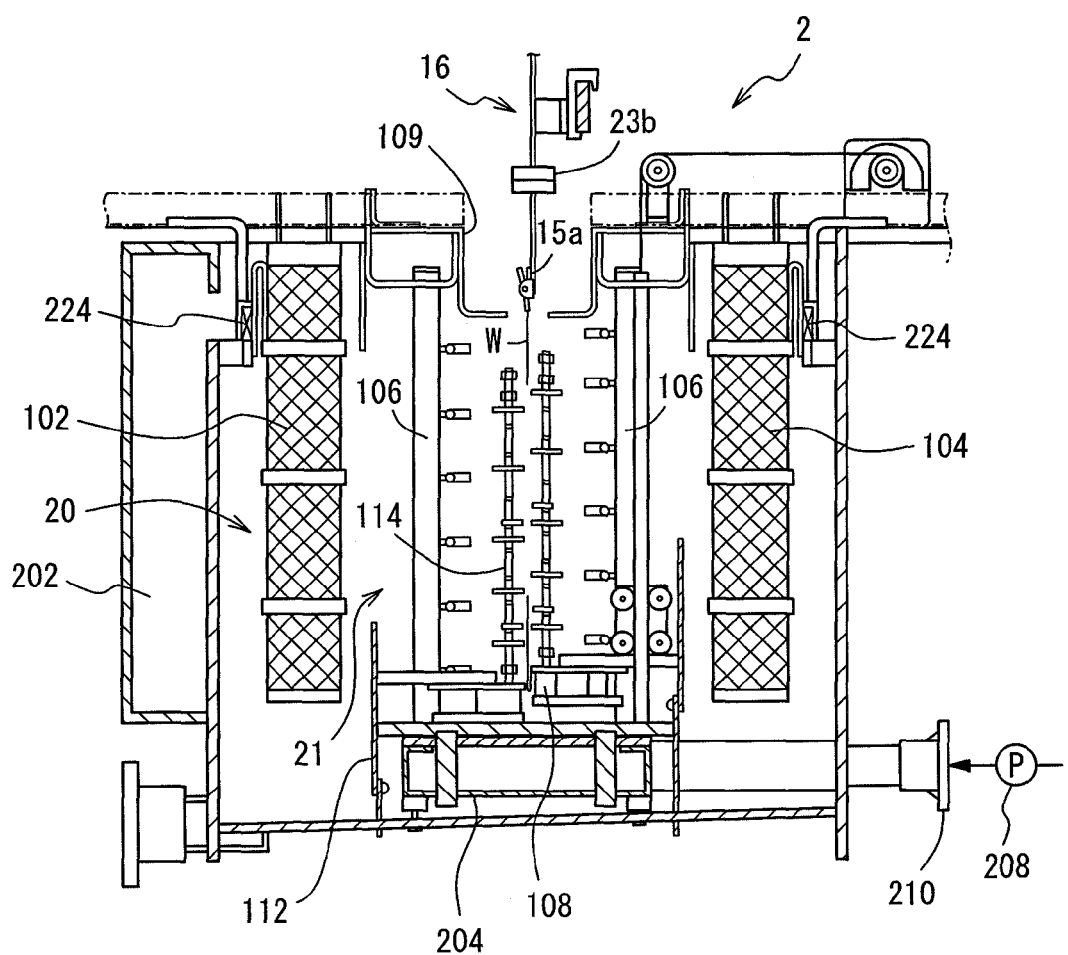
FIG. 2 is a longitudinal sectional view of the plating apparatus.
Figure 3:
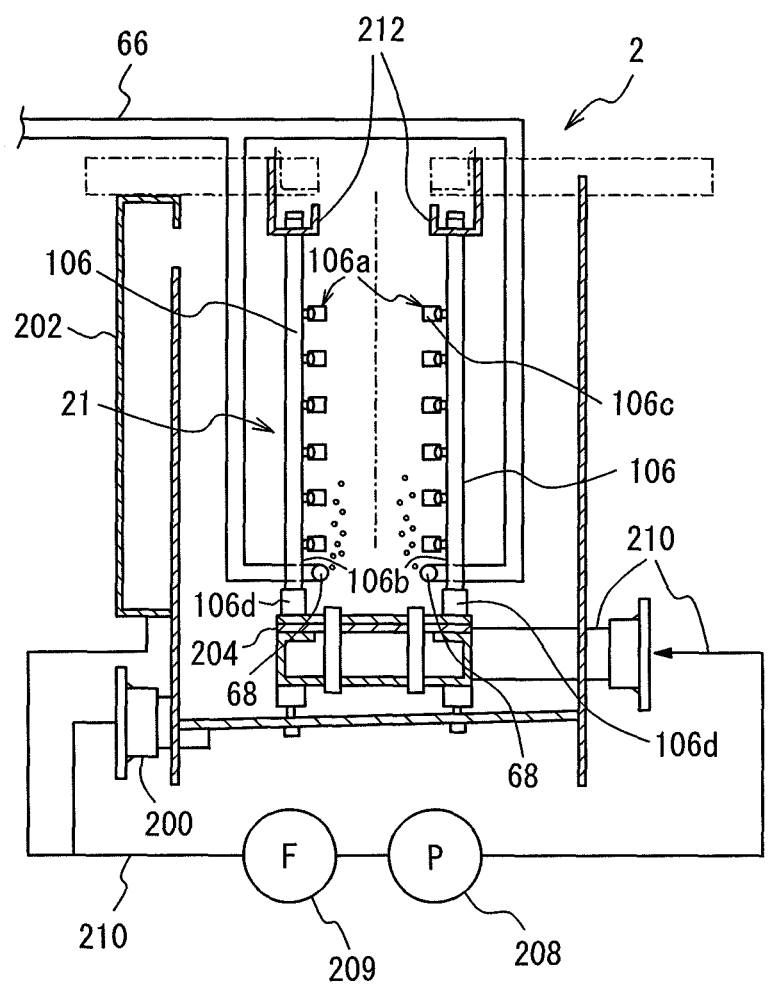
FIG. 3 is a longitudinal sectional view of main structural elements provided in the plating apparatus.

Hereinafter, a plating method according to an embodiment of the invention is described in detail referring to the accompanied drawings. FIGS. 1 through 3 are drawings illustrating a plating apparatus according to an embodiment of the invention that performs the plating method. FIG. 1 is a plan view of an overall structure of the plating apparatus. FIG. 2 is a longitudinal sectional view of the plating apparatus. FIG. 3 is a longitudinal sectional view of main structural elements provided in the plating apparatus. Referring to these drawings, the plating apparatus has guide rails 10 to 13, a pre-plating treatment bath, a plating bath 2, a collecting bath 3, a water rinsing bath 4, an unloader 5, a stripping bath 6, a water rising bath 7, and a loader 8. These structural elements are annularly disposed in the mentioned order The guide rails 10 to 13 form a transport path for transport hangers 15. The transport hangers 15 are members that are transported along the guide rails 10 to 13. Each of the transport hangers 15 has a transport chuck 15a on a lower end thereof. The transport chuck 15a removably holds a work W having a planar shape such as a printed board. The guide rails 10 and 12 are moved upward and downward when the planar-shape work W is held by or removed from the transport hanger 15 and when the planar-shape work W is put in or pulled out of the pre-plating treatment bath 1, plating bath 2, collecting bath 3, and water rising tank 4. The transport hangers 15 are guided by the guide rails 11 and 13 when transported to the plating bath 2 and the stripping bath 6.

The guide rail 10 is provided from the water rinsing bath 7 to the loader 8 and farther to the pre-plating treatment bath 1. The guide rail 11 is provided in the plating bath 2. The guide rail 12 is provided from the collecting bath 3 to the water rinsing bath 4 and farther to the unloader 5. The guide rail 13 is provided in the stripping bath 6. The pre-plating treatment bath 1, plating bath 2, collecting bath 3, water rinsing bath 4, unloader 5, stripping bath 6, water rinsing bath 7, and loader 8 are disposed in the mentioned order along the guide rails 10 to 13. These baths, loader and unloader perform the following treatments to the planar-shape work W that is held by the transport hanger 15 and transported along the guide rails 10 to 13.

In the pre-plating treatment bath 1, a pre-plating treatment is performed to the planar-shape work W held by the transport hanger 15. In the plating bath 2, a plating treatment is performed to the planar-shape work W for which the pre-plating treatment is finished. In the collecting bath 3, a post-plating treatment is performed to the planar-shape work W for which the plating treatment is finished. In the water rinsing bath 4, the planar-shape work W for which the plating treatment is finished is washed with water. The unloader 5 removes the washed planar-shape work W from the transport hanger 15. In the stripping bath 6, any plating residue attached to the transport hanger 15 is stripped off from the transport hanger 15. In the water rinsing bath 7, the plating-stripped transport hanger 15 is washed with water. The loader 8 loads a planar-shape work W to be subjected to the plating in a next round of the plating treatment in the water-washed transport hanger 15.

On the guide rails 10 and 12 moved upward and downward by an elevator not illustrated in the drawings, the planar-shape work W is dipped in the respective baths (pre-plating treatment bath 1, plating bath 2, water rising tank 3, collecting bath 4, and stripping bath 6) and subjected to the treatments. Then, planar-shape work W is collected from these baths.

The plating bath 2 contains therein a plating solution. In the plating bath 2, a metal is precipitated from the plating solution by electroless plating or electroplating, and the planar-shape work W, such as a printed board, is plated with the precipitated metal (filling a through hole).

There are a variety of plating solutions that can be used to plate the planar-shape work W. In the plating treatment performed to fill a through hole formed in a printed board with a plating metal, the plating solution is preferably a copper sulfate plating solution.

The planar-shape work W is hanging down from the transport hanger 15 with an upper end part thereof being held by the transport hanger 15. As the transport hanger 15 moves, the planar-shape work 2 moves in the plating bath 2.

Figure 4:
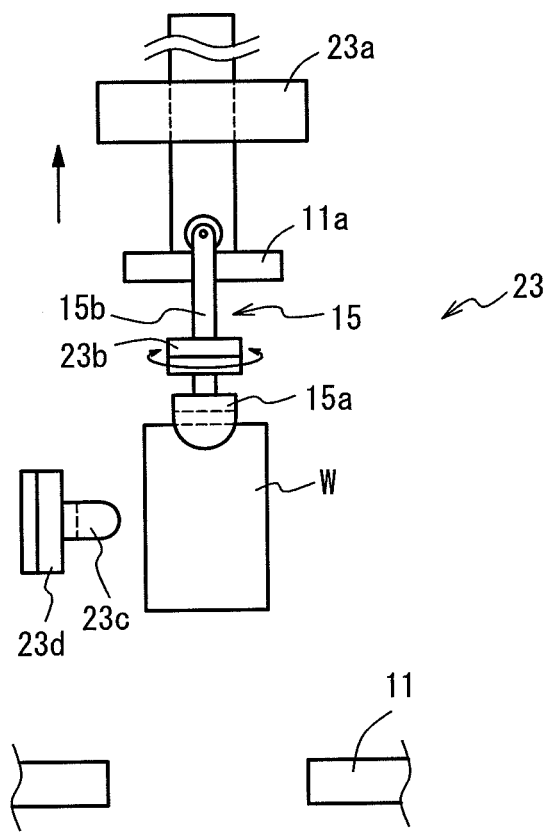
FIG. 4 is a first drawing illustrated to describe an operation of a work reversing unit provided in the plating apparatus.

As illustrated in FIGS. 2 to 4, the plating bath 2 is provided with an anode unit 20 that supplies metal ions for plating, a spray unit 21 that sprays the plating solution onto the planar-shape work W, an air bubble generating tube 68, and a work reversing unit 23.

The anode unit 20 has a number of pairs of anodes 102 and 104 provided at given intervals along a direction where the planar-shape work W moves, and a power feed rail 224 provided in the plating bath 2 along the moving direction of the planar-shape work W. The anodes 102 and 104 are provided in a manner that they hang down from the power feed rail 224. The power feed rail 224 electrically conducts the anodes 102 and 104 thus provided.

The spray unit 21 has an eductor box 204, a pair of spargers 106, a pipe 210, and a circulation pump 208. The eductor box 204 is provided to equalize the pressure of the plating solution. The spargers 106 are provided to spray the plating solution onto the planar-shape work W from both sides of the work W at positions nearer to the work W than the anodes 102 and 104.

In the circulation pump 208, the plating solution discharged from a drain 200 or an overflow bath 202 is filtered through a filter 209 and returns to the eductor box 204 through the pipe 210.

In FIG. 3 illustrating the spray unit 21, the anodes 20 are omitted. The spray unit 21 sprays the plating solution to the planar-shape work W from the spargers 106. The plating solution sprayed from the spargers 106 is discharged from a treatment bath body 100 by way of the drain 200 or the overflow bath 2.02 and filtered through the filter 209. Then, the filtered plating solution is circulated back to the eductor box 204 through the pipe 210 by the circulation pump 208. Then, the plating solution, after its pressure is equalized in the eductor box 204, returns to the spargers 106 again. The plating solution is thus circulated.

There are plural eductor boxes 204 on the bottom surface of the treatment bath body 100. The plural eductor boxes 204 are provided in a manner that they extend along the moving direction of the planar-shape work W. The eductor boxes 204 are secured with bolts in a manner that heights of the eductor boxes 204 are adjustable relative to the bottom plate of the plating bath 2. The eductor boxes 204 each has a communicating hole formed in a side wall thereof. The pipe 210 is connected to the side wall so that a liquid flow runs though the communicating hole.

The spargers 106 have a plurality of nozzle tubes 106b standing upright in the plating bath 2. The nozzle tubes 106b are spaced at equal intervals in parallel with each other along a direction where the transport hanger 15 moves (moving direction of the planar-shape work W). The nozzle tubes 106b are provided in two rows facing each other across the trajectory of the moving planar-shape work W.

The nozzle tubes 106b are standing upright on the eductor box 204. The eductor box 204 and lower ends of the nozzle tubes 106b are connected with the communicating hole so that the liquid flow runs therethrough. An upper end of the nozzle tube 106b is fitted in a hole formed in a nozzle fixating member 212 mounted along the moving direction of the planar-shape work W. This obviates the risk of the spargers 106 being oscillated or tilted (turned over) in a direction opposite to the planar-shape work W by the pressure of the sprayed plating solution.

The nozzle tubes 106b each has a plurality of spray nozzles 106a spaced at certain intervals through which the plating solution is sprayed. In the nozzle tube 106b, the spray nozzles 106a are aligned in a row with equal intervals therebetween. The spray nozzle 106a has a nozzle body 106c and a nozzle oscillator 106d.

The nozzle body 106c of the spray nozzle 106a is formed continuous to the nozzle tube 106b and attached to the nozzle tube 106b in a horizontally oscillatable manner. The nozzle body 106c has a nozzle spray aperture in a tip part thereof. Through the nozzle spray apertures, the plating solution supplied to the nozzle body 106c from the nozzle tube 106b can be sprayed onto the planar-shape work W.

An angular width of the sprayed plating solution is from 0 to +45°, −45° (preferably from 0 to +30°, −30°). An angle at which the plating solution is sprayed through the spray nozzle 106a is a central angle of the angular width. The nozzle oscillator 106d has an oscillation driver (not illustrated in the drawings) embedded therein. The oscillation driver is provided in each of the nozzle tubes 106b. By driving the oscillation driver, the nozzle oscillator 106d can oscillate the nozzle tube 106b around an axis thereof through an arbitrary angle within a predefined range of angles (for example, a range of angles from −80° to +80°) and then hold the nozzle tube 106b at the arbitrary angle. When the nozzle tube 106b is thus oscillated by the nozzle oscillator 106d through the arbitrary angle and then thereby held at the arbitrary angle, the spray angle of the plating solution can be changed in the nozzle bodies 106c of the oscillated nozzle tube 106b.

The air bubble generating tube 68 is supplied with air from the pipe 66 and blows out the air upward into the plating bath 2. As the air is elevated, the plating solution in the around the air is also elevated. As a result, the plating solution in the plating bath 2 is agitated.

Figure 5:
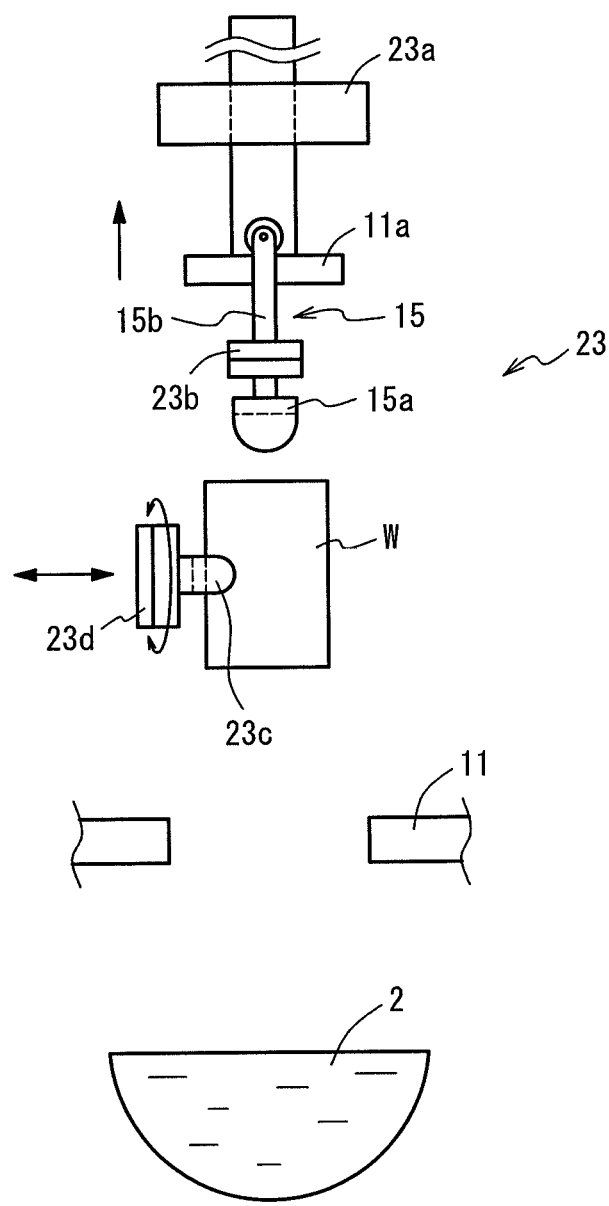
FIG. 5 is a first drawing illustrated to describe the operation of the work reversing unit provided in the plating apparatus.

As illustrated in FIGS. 4 and 5, at least one work reversing unit 23 is provided at an intermediate position on the guide rail 12. The work reversing unit 23 has a work elevator 23a provided in the plating bath 2, a vertical axis reverser 23b, a reversing chuck 23c, and a horizontal axis reverser 23d. The work elevator 23a separates a part of the guide rail 11 and then elevates a separated rail part 11a of the rail 11 to a higher position than the rest of the rail 11. The vertical axis reverser 23b is provided on a support shaft 15b of the transport hanger 15. The vertical axis reverser 23b rotates a lower end part of the support shaft 15b extending downward in the vertical direction around an axis thereof through 180c in a reciprocating manner. By thus rotating the lower end part, the vertical axis reverser 23b oscillates and reverses the planar-shape work W hanging from and retained by the transport chuck 15a in the horizontal direction. The reversing in chuck 23c holds the planar-shape work W elevated by the work elevator 23a and having arrived at a given position during the horizontal reversal period. The horizontal axis reverser 23d is provided on a support shaft of the reversing chuck 23c extending in the horizontal direction. The horizontal axis reverser 23d rotates the reversing chuck 23c around an axis thereof through 180° in a reciprocating manner. By thus rotating the reversing chuck 23c, the horizontal axis reverser 23d oscillates and reverses the planar-shape work W held by the reversing chuck 23c in the vertical direction.

During a period when the planar-shape work W is held by the reversing chuck 23c (vertical reversal period), the transport chuck 15a is not holding the planar-shape work W. When the vertical reversal period is over, the transport chuck 15a starts to hold the planar-shape work W again, and the reversing chuck 23c holding the planar-shape work W accordingly releases the work W.

The reversal of the planar-shape work W by the work reversing unit 23 is described below referring to FIGS. 4 and 5.

Horizontal Reversal

As illustrated in FIG. 4, when the transport chuck 15a arrives on the separated rail part 11a, the transport of the transport chuck 15a is temporarily suspended. Then, the work elevator 23a elevates the separated rail part 11a away from the rail 11, and the planar-shape work W is pulled out of the plating bath 2. After the planar-shape work W is pulled out of the plating bath 2, the vertical axis reverser 23b is driven to oscillate and reverse the planar-shape work W in the horizontal direction. When the horizontal oscillation and reversal is over, the work elevator 23a moves the separated rail part 11a downward to connect the separated rail part 11a with the guide rail 11. As a result, the planar-shape work W is dipped in the plating path 2 and then transported along the guide rail 11, and a remaining part of the plating treatment is performed.

Vertical Reversal

As illustrated in FIG. 5, when the transport chuck 15a arrives on the separated rail part 11a, the transport of the transport chuck 15a is temporarily suspended. Then, the work elevator 23a elevates the separated rail part 11a away from the rail 11, and the planar-shape work W is pulled out of the plating bath 2. After the planar-shape work W is pulled out of the plating bath 2, the reversing chuck 23c on standby at the pull-out position moves in the horizontal direction to a position at which the reversing chuck 23c can hold the planar-shape work W. Then, the reversing chuck 23c holds the planar-shape work W at the position. When the work is held by the reversing chuck 23c, the transport chuck 15a temporarily releases the work W, and the work elevator 23a elevates the transport hanger 15 again. After the transport hanger 15 is elevated by the work elevator 23a, the horizontal axis reverser 23d is driven to oscillate and reverse the planar-shape work W in the vertical direction. When the vertical oscillation and reversal is over, the work elevator 23a moves the transport hanger 15 downward to a position where the transport chuck 15a can hold the work W. The transport chuck 15a that arrived at the position holds the planar-shape work W again. When the work is held by the transport chuck 15a, the reversing chuck 23c releases the work and moves in the horizontal direction to a standby position. After the reversing chuck 23c returns to the standby position, the work elevator 23a moves the separated rail part 1a downward to connect the separated rail part 1a with the guide rail 11. As a result, the planar-shape work W is dipped in the plating path 2 again and then transported along the guide rail 11, and a remaining part of the plating treatment is performed.

According to the embodiment, the plating bath 2 constitutes a plating device, the nozzle oscillator 106d constitutes a spray angle changing device, and the work reversing unit 23 constitutes a substrate posture changing device.

A plating treatment performed for the planar-shape work W by a plating apparatus 100 is hereinafter described. In descriptions of working examples 1 to 5 of the invention and comparative examples 1 to 8 given below, the planar-shape work W is a core substrate constituting a built-up board such as a multilayer printed board, and a plating treatment is performed to fill a through hole h of such a planar-shape work W with a pure metal (to fill the through hole with a plating film (for example, an electrolytic copper plating film).

Prior to plating the through hole with electrolytic copper, a catalyzing treatment and electroless copper plating described below may be performed.

Catalyzing Treatment

Conventional catalyzing treatments are available; for example, catalyzing treatments using tin-palladium colloids, sensitizing-activator technique, and alkali catalyst/accelerator technique.

Electroless Copper Plating

Conventional electroless copper plating treatments are available; for example, plating using alkali bath, and plating using neutral bath. A reducing agent used in these treatments is not particularly limited.

A planar-shape work W used in the examples 1 to 5 and the comparative examples 1 to 8 includes a core substrate having the thickness of 0.4 mm which is a core member of a built-up board, in these examples, a plating layer having the surface thickness of 30 µm is formed by plating in order to fill a through hole of the planar-shape work W having the diameter of 0.1 mm with a metal. Though a through hole h provided in these examples is filled with a plating metal by electroplating, the through hole h may be filled with a plating metal by electroless plating.

The examples and the comparative examples are defined by different conditions including the followings; substrate posture (vertical or horizontal), plating solution spray angle (tilting relative to or in parallel with the perpendicular line of the surface of the planar-shape work W), air bubble spray (whether sprayed or not), adjustment of plating solution spray angle (whether adjusted or not), and adjustment of substrate posture (whether reversed in horizontal direction or vertical direction, or not reversed at all).

Describing the substrate posture (vertical), the planar-shape work W standing upright and held by the transport hanger 15 is transported by the transport hanger 15 in the horizontal direction in the plating bath 2.

Figure 10A:
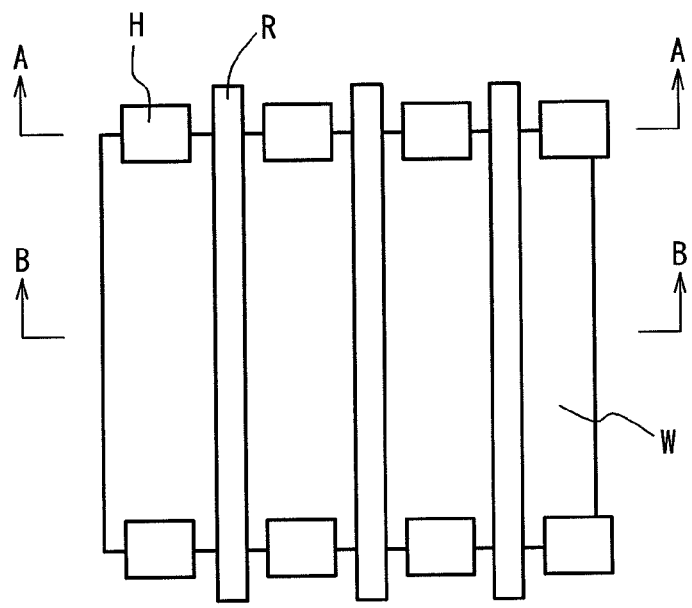
FIG. 10A is a drawing (1) illustrating an example of the another plating method.
Figure 10B:
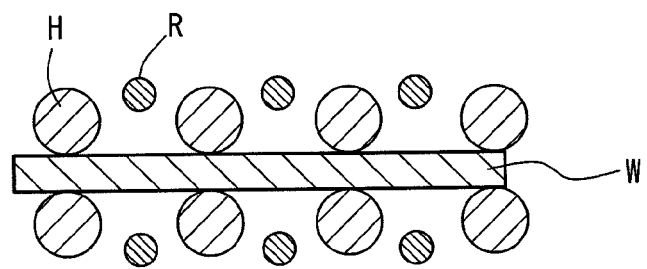
FIG. 10B is drawing (2) illustrating an example of the another plating method.
Figure 10C:
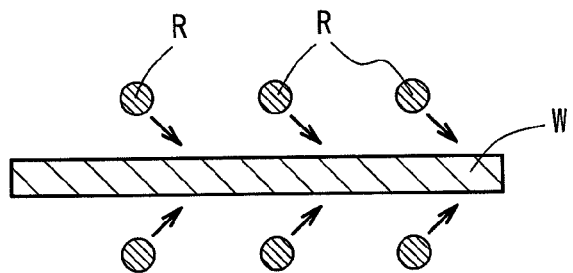
FIG. 10C is drawing (3) illustrating an example of the another plating method.

Describing the substrate posture (horizontal), the planar-shape work W laid down on its side is transported in the plating bath 2 in the horizontal direction by transport rollers H illustrated in FIGS. 10A to 10C.

Describing the plating solution spray angle (tilting), a spray angle at which the plating solution is sprayed from the nozzle body 106c is tilting relative to the perpendicular line of the surface of the planar-shape work W. More specifically, a spray angle $\theta$ formed by the perpendicular line of the planar-shape work W and a direction where the plating solution is sprayed (direction toward the spray center) is included in a range of $-80° < \theta < -30°$ or in a range of $+30° < \theta < +80°$.

With spray angle of plating solution (in parallel), $\theta = 0°$.

Describing the air bubble spray, air bubbles are generated in the air bubble generating tube 68 and discharged into the plating bath 2.

Describing the adjustment of plating solution spray angle, the nozzle oscillator 106d is driven to change the spray angle of the nozzles 106a through a predefined angle during the plating treatment.

Describing the adjustment of substrate posture, the work reversing unit 23 is driven to reverse the posture of the planar-shape work W in the vertical or horizontal direction during the plating treatment.

The following conditions are defined.

Figure 6A:
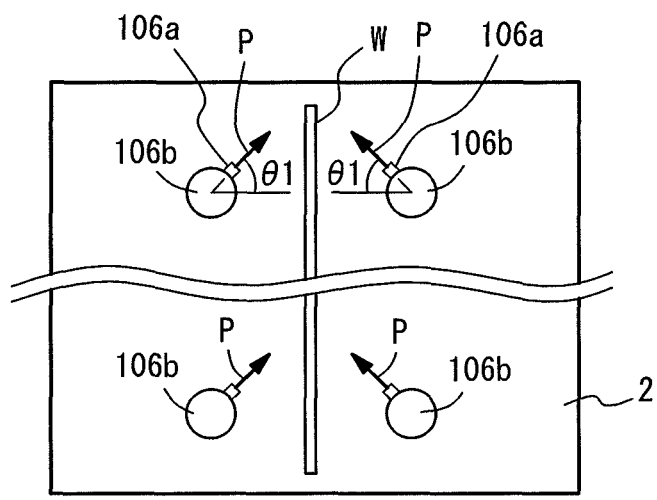
FIG. 6A is a drawing (1) illustrated to describe an operation of a spray unit provided in the plating apparatus.
Figure 6B:
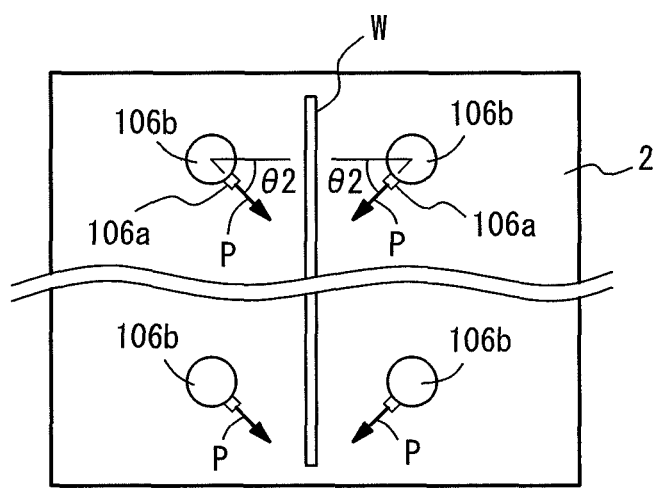
FIG. 6B is a drawing (2) illustrated to describe the operation of the spray unit provided in the plating apparatus.

Condition a: within the scope of the invention
  substrate posture: vertical
  whether plating solution is sprayed: sprayed
  spray angle of plating solution: tilting through +60 to +45° or −60 to −45° relative to perpendicular line of work surface
  whether air bubbles are sprayed: not sprayed
  whether plating solution spray angle is adjusted: adjusted
  method of adjusting plating solution spray angle: change spray angle tilting through 60 to 45° (−60 to −45°) upward as illustrated in FIG. 6A relative to perpendicular line of work surface to tilt through 60 to 45° downward as illustrated in FIG. 6B (+60 to +45°) at a time point when ½ of plating time passed
  whether substrate posture is adjusted: not adjusted Under the condition a, a plating solution P is sprayed through the spray nozzles 106a toward the through hole formed in the work W (not illustrated in the drawings) as illustrated in FIG. 6A. Then, a metal is precipitated from the plating solution P by electroplating or electroless plating to fill the through hole with the metal, and the spray angle of the plating solution P is changed at a time point while the through hole is being filled with the metal as illustrated in FIG. 6B. 6A illustrates plural spray nozzles 106a spaced at equal intervals at laterally symmetrical positions of the work W. The plating solution P is sprayed through the spray nozzles 106a onto the work W from both sides as illustrated with arrows in the drawing. To spray the plating solution, the spray angle is set to a spray angle θ1 non-perpendicular toward one side relative to the perpendicular line of the surface of the work W. At the set spray angle, the plating solution P is sprayed through the spray nozzles 106a from both sides. During the plating treatment, the spray angle of the plating solution P sprayed through the spray nozzles 106a on both sides is changed to a spray angle θ2 non-perpendicular toward the other side relative to the perpendicular line of the surface of the work W as illustrated in FIG. 6B. At the set spray angle, the plating solution P is sprayed through the spray nozzles 106a from both sides. The spray angle θ1 and the spray angle θ2 are preferably an equal angle. Thus, the spray angle of the plating solution to be sprayed toward the through hole of the work W not illustrated in the drawing is changed.

Figure 7A:
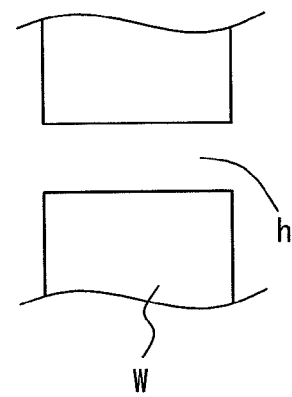
FIG. 7A is a drawing (1) illustrated to describe the formation of a plating film in a through hole of a work.
Figure 7B:
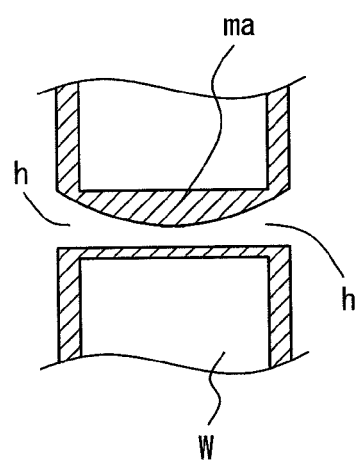
FIG. 7B is a drawing (2) illustrated to describe the formation of the plating film in the through hole of the work.
Figure 7C:
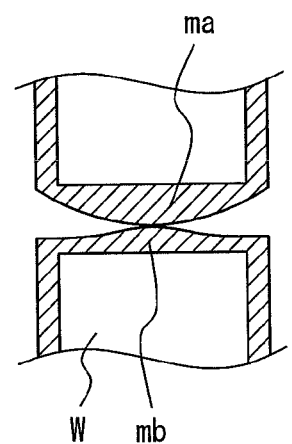
FIG. 7C is a drawing (3) illustrated to describe the formation of the plating film in the through hole of the work.
Figure 7D:
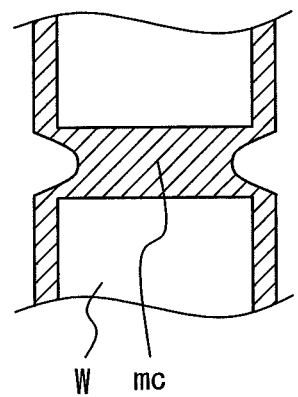
FIG. 7D is a drawing (4) illustrated to describe the formation of the plating film in the through hole of the work.
Figure 7E:
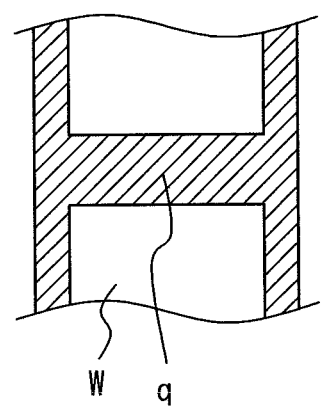
FIG. 7E is a drawing (5) illustrated to describe the formation of the plating film in the through hole of the work.

FIG. 7A is an enlarged view of the work W before the plating treatment. A reference symbol h is a through hole formed in the work W. The plating solution P is sprayed onto the work W at the spray angle θ1 illustrated in FIG. 6A. Then, a pure metal is precipitated on an upper inner surface of the through hole h, and a plating film ma is thereby formed as illustrated in FIG. 7B. The plating film ma has a bulging shape increased in thickness at the center of the through hole h. When the plating solution P is sprayed onto the work W at the spray angle θ2 illustrated in FIG. 6B, the pure metal is precipitated on a lower inner surface of the through hole h, and a plating film nib is thereby formed as illustrated in FIG. 7C. The plating film mb too has a bulging shape increased in thickness at the center of the through hole h. The plating film ma and the plating film nib are finally continuous, forming a plating film mc as illustrated in FIG. 7D. The reason why the plating films ma and mb are grown into such bulging shapes increased in thickness at the center will be described later. The thicknesses of the plating films ma and mb can be changed depending on the spray angles θ1 and θ2 and other factors. As illustrated in FIG. 7D, the continuous plating film mc is grown toward the entrance of the through hole h, and the through hole h is finally completely filled with the plating film mc as illustrated in FIG. 7E. Under the same plating condition, lengths of plating time before and after changing the spray angle of the plating solution P are preferably a half (½) or substantially a half of an overall plating time, respectively.

[Condition b: Beyond the Scope of the Invention]
  substrate posture: vertical
  whether plating solution is sprayed: sprayed
  spray angle of plating solution: tilting through +60 to +45° or −60 to −45° relative to perpendicular line of work surface
  whether air bubbles are sprayed: not sprayed
  whether plating solution spray angle is adjusted: not adjusted
  whether substrate posture is adjusted: not adjusted

[Condition c: Beyond the Scope of the Invention]
  substrate posture: vertical
  whether plating solution is sprayed: sprayed
  spray angle of plating solution: in parallel with perpendicular line of work surface
  whether air bubbles are sprayed: not sprayed
  whether plating solution spray angle is adjusted: not adjusted
  whether substrate posture is adjusted: not adjusted

Figure 8A:
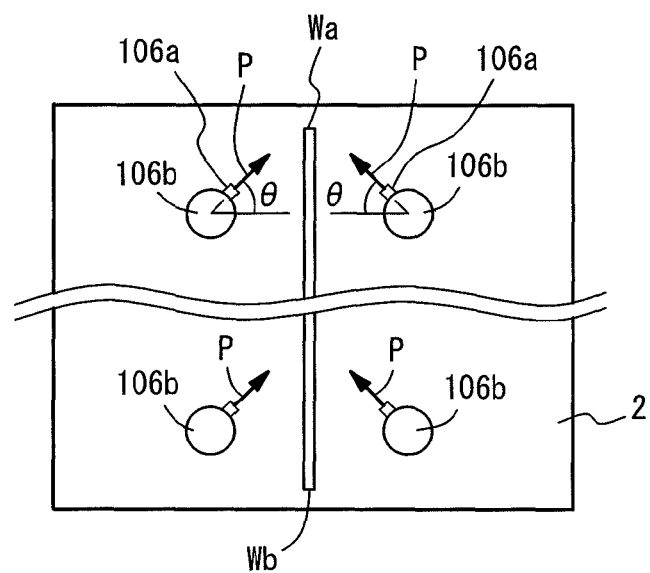
FIG. 8A is a drawing (1) illustrating a plating method according to the embodiment.
Figure 8B:
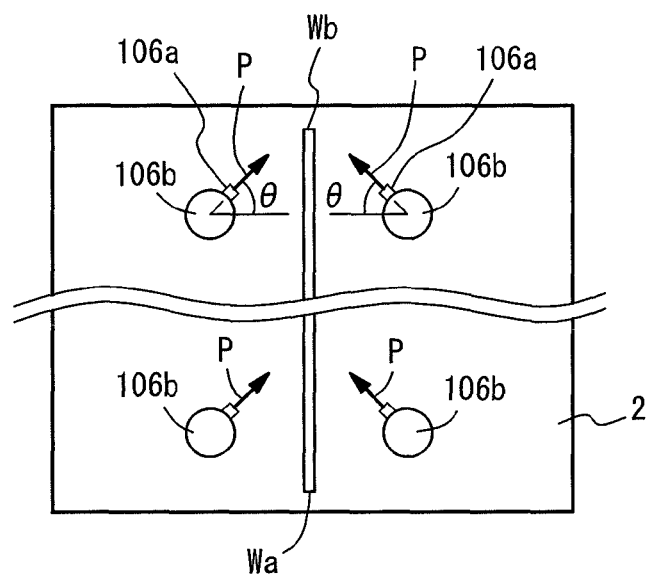
FIG. 8B is a drawing (2) illustrating the plating method according to the embodiment.

[Condition d: Within the Scope of the Invention]
  substrate posture: vertical
  whether plating solution is sprayed: sprayed
  spray angle of plating solution: tilting through +60 to +45° or −60 to −45° relative to perpendicular line of work surface
  whether air bubbles are sprayed: not sprayed
  whether plating solution spray angle is adjusted: not adjusted
  whether substrate posture is adjusted: adjusted
  method of adjusting substrate posture: reverse work W in the horizontal direction at a time point when ½ of plating time passed Under the condition d, while the plating solution P is being sprayed onto the work W, the metal is precipitated from the plating solution P by electroless plating or electroplating to fill the through hole of the work W with the metal. At a time point while the through hole is being filled with the metal, the posture of the work W is changed. As illustrated in FIG. 8, the spray angle at which the plating solution P is sprayed onto the work W is set to the spray angle θ non-perpendicular toward one side relative to the perpendicular line of the work W A. Then, the plating solution P is sprayed onto the work at the set spray angle. In the drawing, one end Wa of the work W is located on the upper side, and the other end Wb of the work W is located on the lower side. The spray angle θ of the plating solution P remains unchanged during the plating treatment. However, the posture of the work W is reversed so that the one end Wa is located on the lower side and the other end Wb is located on the upper side at a time point during the plating treatment as illustrated in FIG. 8B. Then, the plating solution P is sprayed onto the reversed work W. Under the same plating condition, lengths of plating time before and after changing the posture of the work W (horizontal reversal of the work W) are preferably a half (½) or substantially a half of an overall plating time, respectively. Then, the lengths of plating time become equal before and after changing the posture of the printed board. The equal lengths of plating time include exactly equal lengths of plating time and lengths of plating time with a time lag by +−15% or less (preferably, +−10% or less).

[Condition e: Within the Scope of the Invention]
  substrate posture: vertical
  whether plating solution is sprayed: not sprayed
  whether air bubbles are sprayed: sprayed
  whether plating solution spray angle is adjusted: not adjusted
  whether substrate posture is adjusted: adjusted
  method of adjusting substrate posture: reverse work W in the vertical direction at a time point when ½ of plating time passed Under the condition e, air bubbles Q are discharged from the air bubble generating tube 68 into the plating bath 2 as illustrated in FIG. 9. As the air bubbles are elevated, the plating solution around the air bubbles is also elevated. As a result, the plating solution in the plating bath 2 is agitated. Then, the posture of the work W is reversed in the vertical direction at a time point during the plating treatment as illustrated in FIGS. 8A and 8B. Under the same plating condition, lengths of plating time before and after changing the posture of the work W (vertical reversal of the work W) are preferably a half (½) or substantially a half of an overall plating time, respectively. Then, the lengths of plating time become equal before and after changing the posture of the printed board. The equal lengths of plating time include exactly equal lengths of plating time and lengths of plating time with a time lag by +−15% or less (preferably, +−10% or less).

[Condition f: Beyond the Scope of the Invention]
  substrate posture: vertical
  whether plating solution is sprayed: not sprayed
  whether air bubbles are sprayed: sprayed
  whether plating solution spray angle is adjusted: not adjusted
  whether substrate posture is adjusted: not adjusted

[Condition g: within the scope of the Invention]
  substrate posture: horizontal
  whether plating solution is sprayed: sprayed
  spray angle of plating solution: tilting through +60 to +45° or −60 to −45° relative to perpendicular line of work surface
  whether air bubbles are sprayed: not sprayed
  whether plating solution spray angle is adjusted: adjusted
  method of adjusting plating solution spray angle: change spray angle θ of spray nozzle 106 to work W to the angle illustrated in FIGS. 6A and 6B at a time point when ½ of plating time passed
  whether substrate posture is adjusted: not adjusted Under the condition g, the work W is transported in the horizontal direction as illustrated in FIGS. 10A to 10C. FIG. 10A is a plan view of the work W. FIG. 10B is a sectional view of the illustration of FIG. 10A cut along A-A line. FIG. 10C a sectional view of the illustration of FIG. 10A cut along B-B line. A reference symbol H is a transport roller, and a reference symbol R is a plating solution spray pipe. While the work W is being transported in the horizontal direction by the transport rollers H, the spray angle is changed as illustrated in FIGS. 6A and 6B, and the plating solution P is sprayed onto the work W from the plating solution spray pipes R at the changed angle. Under the same plating condition, lengths of plating time before and after changing the spray angle of the plating solution P are preferably a half (½) or substantially a half of an overall plating time, respectively. Then, the lengths of plating time become equal before and after changing the posture of the printed work W. The equal lengths of plating time include exactly equal lengths of plating time and lengths of plating time with a time lag by +−15% or less (preferably, +−10% or less).

[Condition h: Within the Scope of the Invention]
  substrate posture: horizontal
  whether plating solution is sprayed: sprayed
  spray angle of plating solution: tilting through ±60 to +45° or −60 to −45° relative to perpendicular line of work surface
  whether air bubbles are sprayed: not sprayed
  whether plating solution spray angle is adjusted: not adjusted
  whether substrate posture is adjusted: adjusted
  method of adjusting substrate posture: reverse work W in the horizontal direction at a time point when ½ of plating time passed Under the condition h, the work W is transported in the horizontal direction as illustrated in FIGS. 10A to 10C. The posture of the work W is changed as illustrated in FIGS. 8A and 8B, and the plating solution is sprayed onto the work W. Under the same plating condition, lengths of plating time before and after changing the posture of the work W (horizontal reversal of the work W) are preferably a half (½) or substantially a half of an overall plating time, respectively. Then, the lengths of plating time become equal before and after changing the posture of the printed board. The equal lengths of plating time include exactly equal lengths of plating time and lengths of plating time with a time lag by +−15% or less (preferably, +−10% or less).

[Condition i: Beyond the Scope of the Invention]
  substrate posture: horizontal
  whether plating solution is sprayed: sprayed
  spray angle of plating solution: tilting through +60 to +45° or −60 to −45° relative to perpendicular line of work surface
  whether air bubbles are sprayed: not sprayed
  whether plating solution spray angle is adjusted: not adjusted
  whether substrate posture is adjusted: not adjusted The examples and the comparative examples carried out under these different conditions are hereinafter described. In the examples and the comparative examples, surfaces of the through hole h after the plating treatment were analyzed through cross-sectional observation. More specifically, the presence or absence of any voids and/or seams and shapes of the plating films formed by precipitating the metal were observed with a metallurgical microscope.

EXAMPLE 1

Figure 11:
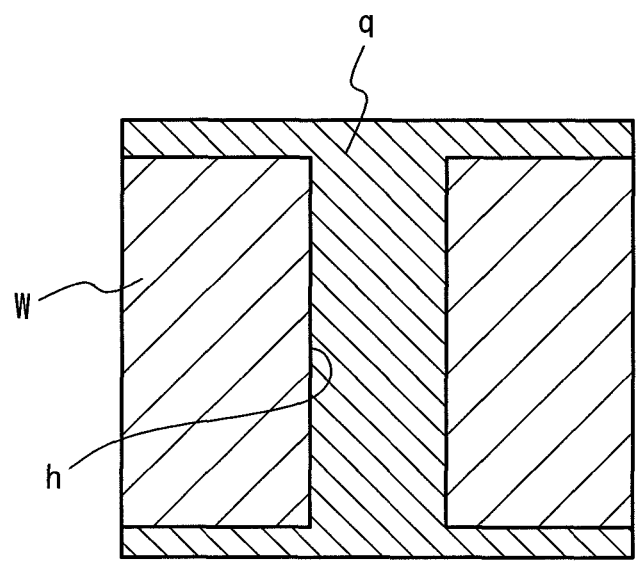
FIG. 11 is a drawing illustrating a state of a through hole plated with a metal by the plating method according to the invention.

In the example 1, the through hole h of the planar-shape work W was subjected to the plating treatment under the following condition to be filled with a pure metal q. As a result, the through hole h was favorably filled with the pure metal q with neither of voids nor seams as illustrated in FIG. 11.
  condition: a
  current density (A/dm$^2$): 1.5
  required time for plating: 90 minutes

EXAMPLE 2

In the example 2, the through hole h of the planar-shape work W was subjected to the plating treatment under the following condition to be filled with the pure metal q. As a result, the through hole h was favorably filled with the pure metal q with neither of voids nor seams as illustrated in FIG. 11.
   condition: d
   current density (A/dm$^2$): 1.5
   required time for plating: 90 minutes

EXAMPLE 3

In the example 3, the through hole h of the planar-shape work W was subjected to the plating treatment under the following condition to be filled with the pure metal q. As a result, the through hole h was favorably filled with the pure metal q with neither of voids nor seams as illustrated in FIG. 11.
   condition: e
   current density (A/dm$^2$): 1.5
   required time for plating: 90 minutes

EXAMPLE 4

In the example 4, the through hole h of the planar-shape work W was subjected to the plating treatment under the following condition to be filled with is the pure metal q. As a result, the through hole h was favorably filled with the pure metal q with neither of voids nor seams as illustrated in FIG. 11.
   condition: g
   current density (A/dm$^2$): 1.5
   required time for plating: 90 minutes

EXAMPLE 5

In the example 5, the through hole h of the planar-shape work W was subjected to the plating treatment under the following condition to be filled with the pure metal q. As a result, the through hole h was favorably filled with the pure metal q with neither of voids nor seams as illustrated in FIG. 11.
   condition: h
   current density (A/dm$^2$): 1.5
   required time for plating: 90 minutes

COMPARATIVE EXAMPLE 1

Figure 12:
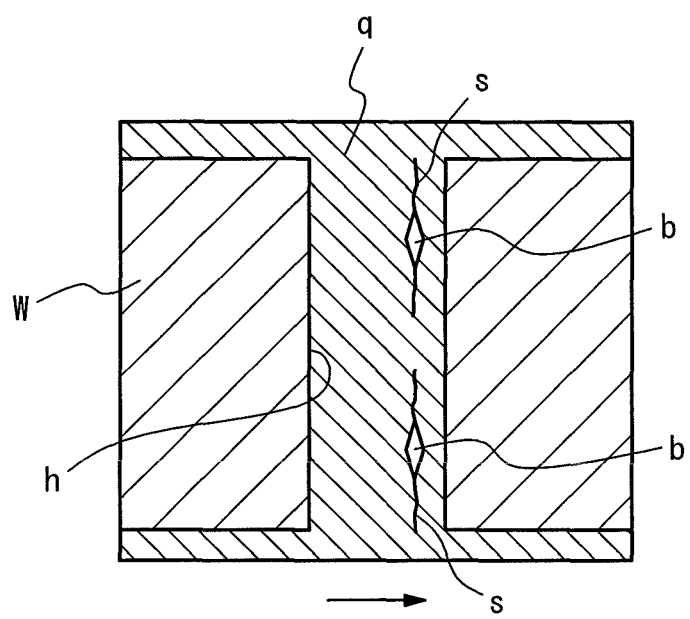
FIG. 12 is a drawing illustrating a first state of a through hole plated with a metal by a plating method according to a comparative example.

In the comparative example 1, the through hole h of the planar-shape work W was subjected to the plating treatment under the following condition to be filled with the pure metal q. As a result, the through hole h was not adequately filled with the pure metal q, and voids b and seams s were generated in vicinity of the opening of the through hole as illustrated in FIG. 12. In the comparative example 1 where the spray angle of the plating solution was not adjusted, the plating solution flowed in a direction illustrated with an arrow in FIG. 12.
   condition: b
   current density (A/dm$^2$): 1.5
   required time for plating: 90 minutes

COMPARATIVE EXAMPLE 2

Figure 13:
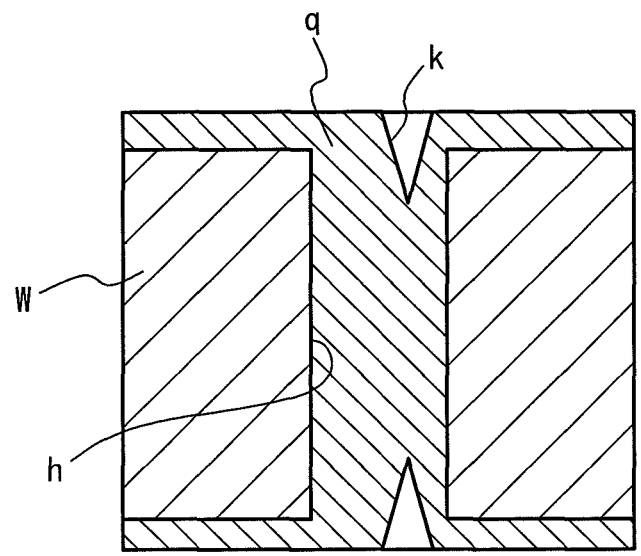
FIG. 13 is a drawing illustrating a second state of a through hole plated with a metal by a plating method according to a comparative example.

In the comparative example 2, the through hole h of the planar-shape work W was subjected to the plating treatment under the following condition to be filled with the pure metal q. As a result, the surface of the pure metal filling the through hole h was not flattened, and dents k were formed therein as illustrated in FIG. 13.
   condition: b
   current density (A/dm$^2$): 1.0
   required time for plating: 135 minutes

COMPARATIVE EXAMPLE 3

Figure 14:
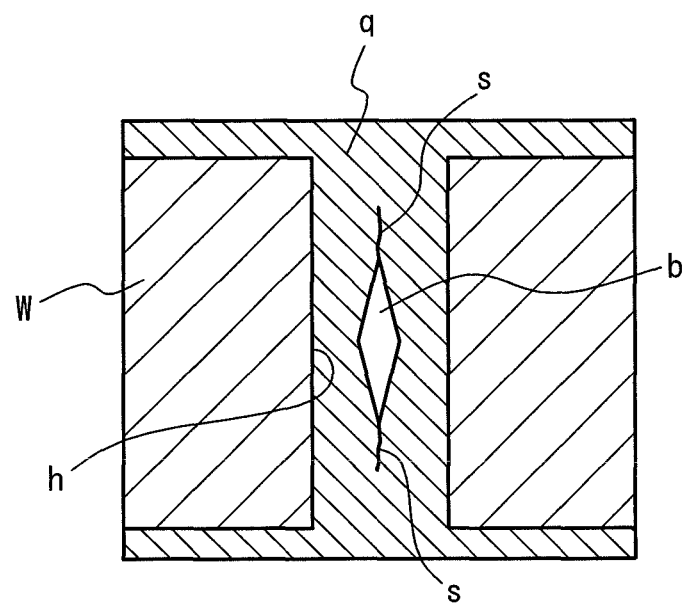
FIG. 14 is a drawing illustrating a third state of a through hole plated by a plating method according to a comparative example.

In the comparative example 3, the through hole h of the planar-shape work W was subjected to the plating treatment under the following condition to be filled with the pure metal q. As a result, the through hole h was favorably filled with the pure metal q with neither voids nor seams as illustrated in FIG. 14. However, the plating treatment took 180 minutes, which was twice as long as the plating time (90 minutes) in the examples 1 to 5. Thus, the productivity significantly deteriorated. In the comparative example 3, the plating metal (pure metal q) had the surface thickness of 40 µm.
   condition: b
   current density (A/dm$^2$): 1.0
   required time for plating: 180 minutes

COMPARATIVE EXAMPLE 4

In the comparative example 4, the through hole h of the planar-shape work W was subjected to the plating treatment under the following condition to be filled with the pure metal q. As a result, the through hole h was not adequately filled with the pure metal q, and a void b and seams s were generated in vicinity of the center of the through hole in a depth direction thereof (substrate thickness direction) as illustrated in FIG. 14.
   condition: c
   current density (A/dm$^2$): 1.5
   required time for plating: 90 minutes

COMPARATIVE EXAMPLE 5

In the comparative example 5, the through hole h of the planar-shape work W was subjected to the plating treatment under the following condition to be filled with the pure metal q. As a result, the through hole h was not adequately filled with the pure metal q, and a void b and seams s were generated in vicinity of the center of the through hole in the depth direction thereof (substrate thickness direction) as illustrated in FIG. 14.
   condition: c
   current density (A/dm$^2$): 1.0
   required time for plating: 135 minutes

COMPARATIVE EXAMPLE 6

In the comparative example 6, the through hole h of the planar-shape work W was subjected to the plating treatment under the following condition to be filled with the pure metal q. As a result, the through hole h was hardly filled with the pure metal as illustrated in FIG., 15.
   condition: c
   current density (A/dm$^2$): 0.5
   required time for plating: 270 minutes

COMPARATIVE EXAMPLE 7

In the comparative example 7, the through hole h of the planar-shape work W was subjected to the plating treatment under the following condition to be filled with the pure metal q. As a result, the through hole h was not adequately filled with the pure metal q, and a void h and seams s were generated in vicinity of the opening of the through hole as illustrated in FIG. 12. In the comparative example 7 where the spray angle of the plating solution was not adjusted, the plating solution flowed in the direction illustrated with an arrow in FIG. 12.

condition: f
current density (A/dm$^2$): 1.5
required time for plating: 90 minutes

COMPARATIVE EXAMPLE 8

Figure 16A:
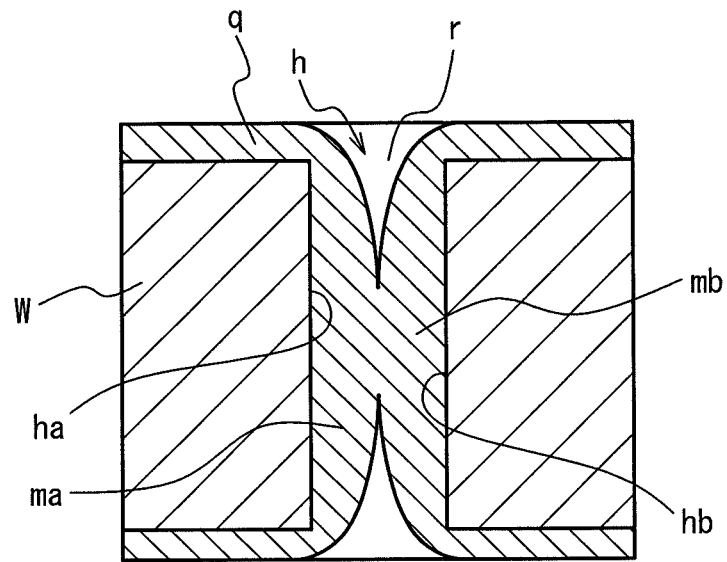
FIG. 16A is a drawing (1) illustrated to describe the respective states of the through hole plated by the plating method according to the invention and the plating method according to the comparative example.

In the comparative example 8, the through hole h of the planar-shape work W was subjected to the plating treatment under the following condition to be filled with the pure metal q. As a result, the through hole h was not adequately filled with the pure metal q, and a void b and seams s were generated in vicinity of the opening of the through hole as illustrated in FIG. 12. In the comparative example 8 where the spray angle of the plating solution was not adjusted, the plating solution flowed in the direction illustrated with an arrow in FIG. 12.

condition: i
current density (A/dm$^2$): 1.5
required time for plating: 90 minutes The differences between the examples 1 to 5 and the comparative examples were analyzed, a result of which will be hereinafter described. First, the examples 1 to 5 are analyzed below.

in the example 1 where the spray angle of the plating solution was adjusted (the spray direction of the plating solution was changed), the plating solution diffused and arrived at the deepest end of the through hole h. As a result, the plating films ma and nib were equally thickened and bulging on inner wall surfaces ha and hb of the through hole h formed in the planar-shape work W as illustrated on the left and right in FIG. 16A. Because the plating films ma and mb were both grown and bulging in a curved manner, a gap r formed between the plating films ma and mb was relatively large from the opening to the deepest end of the through hole. Because the plating films ma and nib were grown with the gap r left open in a relatively large size, the plating solution penetrated farther into the gap r until the growths of the plating films ma and mb were completed. As a result, the through hole h was completely filled with the pure metal q formed by the integrated plating films ma and mb.

The reason why the plating films ma and mb form such thickened bulges is described below. When the plating solution flows from outside into deep down the through hole h, the plating solution is agitated well in vicinity of the opening of the hole but is not agitated well enough in deeper parts of the hole than the opening.

The plating solution conventionally contains an inhibitor that inhibits the growths of the plating films and an accelerator that accelerates the growths. The inhibitor having a large molecular weight is difficult to reach the parts where the agitation of the plating solution is weak. On the other hand, the accelerator having a smaller molecular weight than the inhibitor is more likely to reach the parts where the agitation of the plating solution is weak.

When the plating solution containing the inhibitor and the accelerator thus differently characterized flows into the through hole h for the plating treatment, the accelerator easily penetrates into deeper parts of the hole, whereas the inhibitor, a large portion of which is present in vicinity of the opening, is difficult to penetrate into the deeper parts of the hole. The plating films ma and mb form the thickened bulges due to such maldistribution of the accelerator and the inhibitor in the through hole h.

Figure 19:
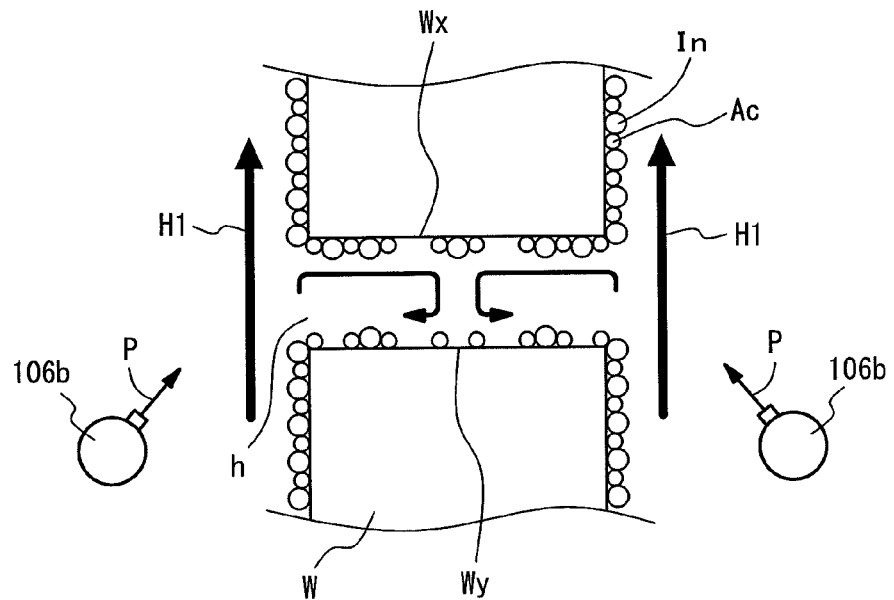
FIG. 19 is a drawing (1) illustrated to describe a relationship between a flow of plating solution and a thickened bulge.

A description is given below to a relationship between the plating solution flow and the thickened bulge. A spray angle non-perpendicular to the planar-shape work W is set (tilting upward in the drawing) as illustrated in FIG. 19, and the plating solution P is sprayed from the nozzle tubes 106b onto the work W at the set spray angle. Then, a liquid flow H1 of the plating solution directed upward on the drawing occurs in vicinity of the surface of the planar-shape work W. The agitation of the plating solution in the through hole h caused by the liquid flow H1 is most weakened in vicinity of a part Wy of a deeper-side surface of the through hole h on the opposite side of a liquid flow direction. An inhibitor In having a large molecular weight is difficult to reach the vicinity of the agitation-weakened part Wy; and an amount of adsorption of the inhibitor to the vicinity of Wy is to accordingly small. On the other hand, an accelerator Ac having a small molecular weight easily reaches the vicinity of the agitation-weakened part Wy, and a large amount of the accelerator is adsorbed to the vicinity of Wy. In the Wy therefore, the impact of the accelerator Ac is more aggressive, and the plating film increases in thickness, forming the thickened bulge. When the spray angle of the plating solution P is changed at a time point during the plating treatment, the liquid flow in vicinity of the surface of the planar-shape work W changes, and positions in the through hole h where the agitation of the plating solution is weakened accordingly change. As a result, the thickened bulges are generated in the plating films ma and mb in the through hole h.

To supply metal ions farther into the through hole h, the plating solution P is preferably agitated well enough and then flows into the through hole h. To this end, the spray angle is preferably adjusted at a midpoint during an overall plating time so that a length of plating time before changing the spray angle of the plating solution and a length of plating time after changing the spray angle are equal. The equal lengths of plating time include exactly equal lengths of plating time and lengths of plating time with a time lag by +−15% or less (preferably, +−10% or less).

Preferably, the spray unit 21 is provided on front and back surfaces both of the planar-shape work W, and the spray units 21 provided on the front and back surfaces respectively spray the plating solution onto the front and back surfaces of the planar-shape work W in mirror-image symmetry. The spray unit 21 according to the present embodiment sprays the plating solution in this manner. The mirror-image symmetry includes totally identical mirror-image symmetry and mirror-image symmetry with a positional error by +−15% or less (preferably, +−10% or less).

The example 2 is different from the example 1 as to whether the plating solution spray angle is adjusted and whether the substrate posture is adjusted but is identical to the example 1 otherwise. The example 1 adjusts the plating solution spray angle. The example 2 adjusts the substrate posture (horizontal reversal). In the example 2 wherein the substrate posture is adjusted, the positions where the agitation of the plating solution is weakened change. In the example 2, therefore, the through hole h is completely filled with the pure metal q formed by the integrated plating films ma and nib because of a reason similar to the example 1.

Figure 20:
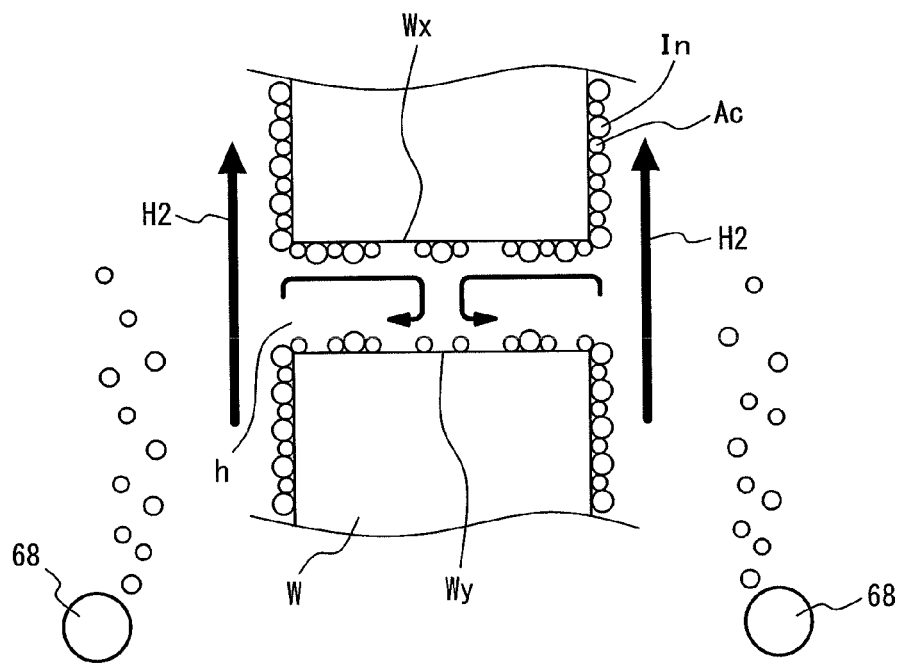
FIG. 20 is a drawing (2) illustrated to describe the relationship between the flow of plating solution and the thickened bulge.

The example 3 is different from the example 2 as to whether the plating solution is sprayed, whether air bubbles are sprayed, and whether the substrate posture is adjusted but is identical to the example 2 otherwise. The example 2 sprays the plating solution and reverses the substrate posture in the horizontal direction. The example 3 sprays air bubbles and reverses the substrate posture in the vertical direction. As illustrated in FIG. 20, air bubbles discharged from the air bubble generating tube 68 causes a liquid flow H2 of the plating solution directed from the bottom side of the plating bath 2 toward the upper opening in vicinity of the surface of the planar-shape work W. As a result of the agitation of the plating solution caused by the liquid flow H2 in the through hole h, the thickened bulges are generated in the plating films of the through hole h because of a reason similar to the example 1.

The example 3 reverses the substrate posture of the planar-shape work W in the vertical direction to more efficiently agitate the plating solution. In the example 3 wherein the substrate posture is thus adjusted, the through hole h is completely filled with the pure metal q formed by the integrated plating films ma and mb because of a reason similar to the example 2.

The example 4 is different from the example 1 as to the posture of the planar-shape work W during the transport but is identical to the example 1 otherwise. The example 1 transports the planar-shape work W standing upright. The example 4 transports the planar-shape work W laid down on its side. In the example 4 wherein the spray angle of the plating solution is adjusted, the through hole h is completely filled with the pure metal q formed by the integrated plating films ma and mb because of a reason similar to the example 1.

The example 5 is different from the example 4 as to whether the spray angle of the plating solution is adjusted and whether the substrate posture is adjusted but is identical to the example 4 otherwise. The example 4 adjusts the spray angle of the plating solution. The example 5 adjusts the substrate posture (horizontal reversal). In the example 5 wherein the substrate posture is adjusted, the through hole h is completely filled with the pure metal q formed by the integrated plating films ma and nib because of a reason similar to the example 1.

Figure 16B:
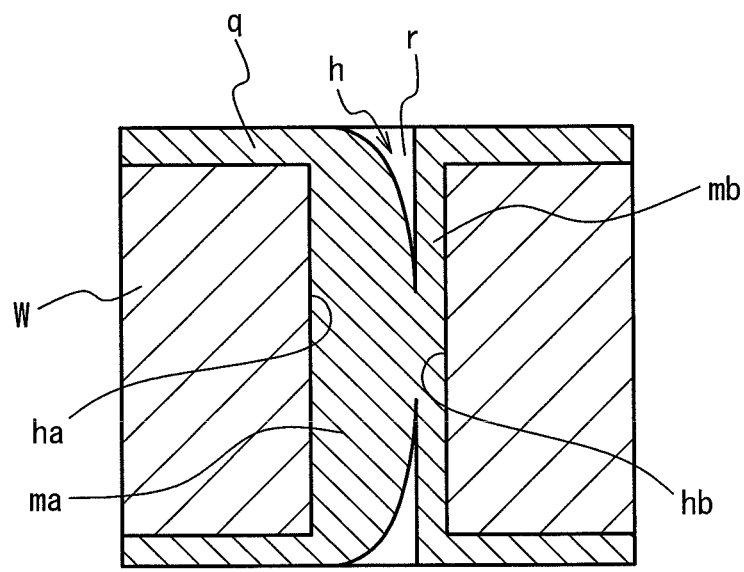
FIG. 16B is a drawing (2) illustrated to describe the respective states of the through hole plated by the plating method according to the invention and the plating method according to the comparative example.

Next, the differences between the example 1 and the comparative example 1 are described. The example 1 is different from the comparative example 1 as to whether the spray angle of the plating solution is adjusted but is identical to the comparative example 1 otherwise. In the comparative example 1 wherein the spray angle is not adjusted, of the inner wall surfaces ha and hb of the through hole h formed in the planar-shape work W, the thickened bulge is grown in the plating film ma on the inner wall surface ha alone but is hardly generated in the plating film on the other inner wall surface hb as illustrated in FIG. 16B.

The plating film ma alone is bulging in a curved shape toward the plating film mb on the other side. Therefore, the gap r formed between the plating films ma and nib accordingly has an opening width about a half of that of the example 1.

When the plating films run and mb are formed with the gap r having such a small opening width, the plating solution does not sufficiently penetrate into the deeper parts of the gap r by the time when the growths of the plating films ma and mb are completed.

As a result, the through hole h was not completely filled with the pure metal q formed by the integrated plating films ma and mb, and the void b and seams s were generated therein.

In the comparative example 2, the condition of the comparative example 1 was changed in view of the obtained result of the comparative example 1; the current density was decreased to 1.0 A/dm², and the required time for plating was extended to 135 minutes. The current density down to 1.0 A/dm² reduced the impact of the accelerator, helping the plating to grow uniformly. This, however, slows down the plating growth at the axial position of the through hole. As a result, the surface of the pure metal q was not flattened, and the dents k were formed therein although the required time for plating was extended to 135 minutes.

In the comparative example 3, the condition of the comparative example 2 was changed in view of the obtained result of the comparative example 2; the required time for plating was extended to 180 minutes. As a result, the through hole was filled with the pure metal q with neither voids b nor seams s. However, the required time for plating of 180 minutes was too long for practical use.

The comparative example 4 is different from the comparative example 1 as to the spray angle of the plating solution but is identical to the comparative example 1 otherwise. The comparative example 1 sets the spray angle of the plating solution to a degree with a tilt from the perpendicular line of the work surface. The comparative example 4 sprays the plating solution in parallel with the perpendicular line of the work surface. When the through hole h is subjected to the plating treatment, electric current flow is facilitated near the opening of the through hole as compared to the deeper parts thereof. In the comparative example 4, such current density characteristics during the plating treatment accelerate the plating growth near the opening of the through hole as compared to the deeper parts thereof. As a result, the void b and the seams s were formed inside of the pure metal q.

In the comparative example 5, the condition of the comparative example 4 was changed in view of the obtained result of the comparative example 4; the current density was decreased to 1.0 A/dm², and the required time for plating was extended to 135 minutes. However, these changes were still insufficient, and the void h and seams s were formed inside of the pure metal q.

In the comparative example 6, the condition of the comparative example 5 was changed in view of the obtained result of the comparative example 5; the current density was decreased to 0.5 A/dm², and the required time for plating was extended to 180 minutes. However, the pure metal q was precipitated in an exact shape of the through hole.

The comparative example 7 is different from the comparative example 1 as to whether the plating solution is sprayed and whether air bubbles are sprayed but is identical to the comparative example 1 otherwise. The comparative example 1 sprays the plating solution. The comparative example 7 does not spray the solution but sprays air bubbles. Because of a reason similar to the comparative example 1, the void b and seams s were formed in the comparative example 7 in the same parts of the pure metal q as in the comparative example 1.

The comparative example 8 is different from the comparative example 1 as to the posture of the planar-shape work W during the transport but is identical to the comparative example 1 otherwise. The comparative example 1 transports the planar-shape work W standing upright. The comparative example 8 transports the planar-shape work W laid down on its side. Because of a reason similar to the comparative example 1, the void b and seams s were formed in the comparative example 8 in the same parts of the pure metal q as in the comparative example 1.

In the examples 1, 2, 4, and 5 described so far, the spray angle of the plating solution was set to a degree with a tilt through +60 to +45° or −60 to −45°. Although this angular range was employed to most effectively form the streamlined flow of the plating solution in the through hole h, the streamlined flow of the plating solution can be formed in the through hole h as far as the spray angle of the plating solution is +80 to +30° or −80 to −30°. To agitate the plating solution more efficiently, the spray angle preferably has an equal absolute value before and after changing the spray angle of the plating solution. During the plating treatment, the spray angle of the plating solution may be constantly changed within the angular range (−80 to +80°, preferably −60 to +60°), in which case effects similar to those of the other examples can be obtained.

A plating apparatus for performing the method according to the invention preferably includes a plating device that makes the metal precipitated from the plating solution by electroless plating or electroplating and fills the through hole with the precipitated metal while, spraying the plating solution onto the printed board, and a spray angle changing device that changes the spray angle of the plating solution at a time point while the through hole is being filled with the metal.

A plating apparatus for performing the method according to the invention preferably includes a plating device that makes the metal precipitated from the plating solution by electroless plating or electroplating and fills the through hole with the precipitated metal while spraying the plating solution onto the printed board, and a substrate posture changing device that changes the posture of the printed board at a time point while the plating solution is being sprayed by the plating device.

A plating apparatus for performing the method according to the invention preferably includes a plating device that dips the printed board in the plating solution and that makes the metal precipitated from the plating solution by electroless plating or electroplating and fills the through hole of the printed board with the precipitated metal while spraying air bubbles onto the printed board in the plating solution, and a substrate posture changing device that changes the posture of the printed board at a time point while the through hole is being filled with the metal.

The invention is applicable to electrolytic copper plating employed to form wirings in printed boards to be plated (including plastic packaging substrates and semiconductor packaging substrates).

Another Embodiment

Figure 17:
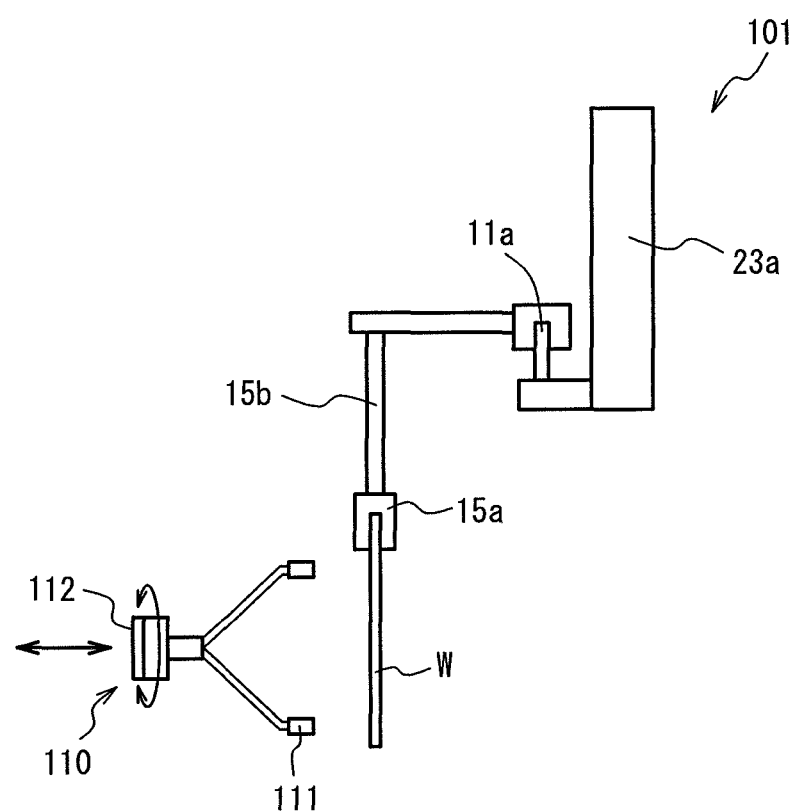
FIG. 17 is an illustration of a plating apparatus according to another embodiment of the invention.

In this embodiment, a rotation process described below is performed by using a plating apparatus 101 illustrated in FIG. 17. The plating apparatus 101 includes work rotators 110, wherein the work rotators 110 each has adsorbers 111 and a horizontal axis rotator 112. The adsorber 111 is an air intake port to which the planar-shape work W is adsorbed. There are four adsorbers 111 in total; two at upper left and right positions and another two at lower left and right positions. The four corners of the planar-shape work W are adsorbed to the respective adsorbers 111. All of the four adsorbers 111 are supported on the horizontal axis rotator 112 and rotated altogether through 90 degrees at a time around the horizontal axis of the horizontal axis rotator 112. The adsorbers 111 thus rotated can turn the posture of the planar-shape work W through 90 degrees at a time. There are four work rotators 110 at intermediate positions on the guide rail 12. Any other structural characteristics of the plating apparatus 101 are similar to those of the plating apparatus according to the embodiment described earlier.

Rotation Process

When the transport chuck 15a arrives on the separated rail part 11a as illustrated in FIG. 5, the transport of the transport chuck 15a is temporarily suspended. Then, the work elevator 23a elevates the separated rail part 11a away from the guide rail 11, and the planar-shape work W is pulled out of the plating bath 2. After the planar-shape work W is pulled out of the plating bath 2, the adsorbers 111 on standby at pull-out positions move in the horizontal direction to a position at which the planar-shape work W can be adsorbed to the adsorbers 111, and the planar-shape work W is adsorbed to these adsorbers. When the work is adsorbed to the adsorbers 111, the transport chuck 15a temporarily releases the work, and the work elevator 23a elevates the transport hanger 15 again. After the hanger is elevated by the work elevator 23a, the horizontal axis rotator 112 is driven to rotate the planar-shape work W through 90 degrees. After the planar-shape work W is rotated, the work elevator 23a moves the transport hanger 15 downward to a position at which the work can be held by the transport chuck 15a. The transport chuck that arrived at the position holds the planar-shape work W again. When the work is held by the transport chuck 15a, the adsorbers 111 release the work and moves in the horizontal direction to return to the standby positions. When the adsorbers 111 arrived at the standby positions, the work elevator 23a moves the separated rail part 11a downward to connect the separated rail part 11a with the guide rail 11. The planar-shape work W is thereby dipped in the plating bath 2 again and transported along the guide rail 11, and a remaining part of the plating treatment is performed.

A condition of the plating treatment performed by the plating apparatus 101 and an example of the plating treatment are hereinafter described.

Figure 18:
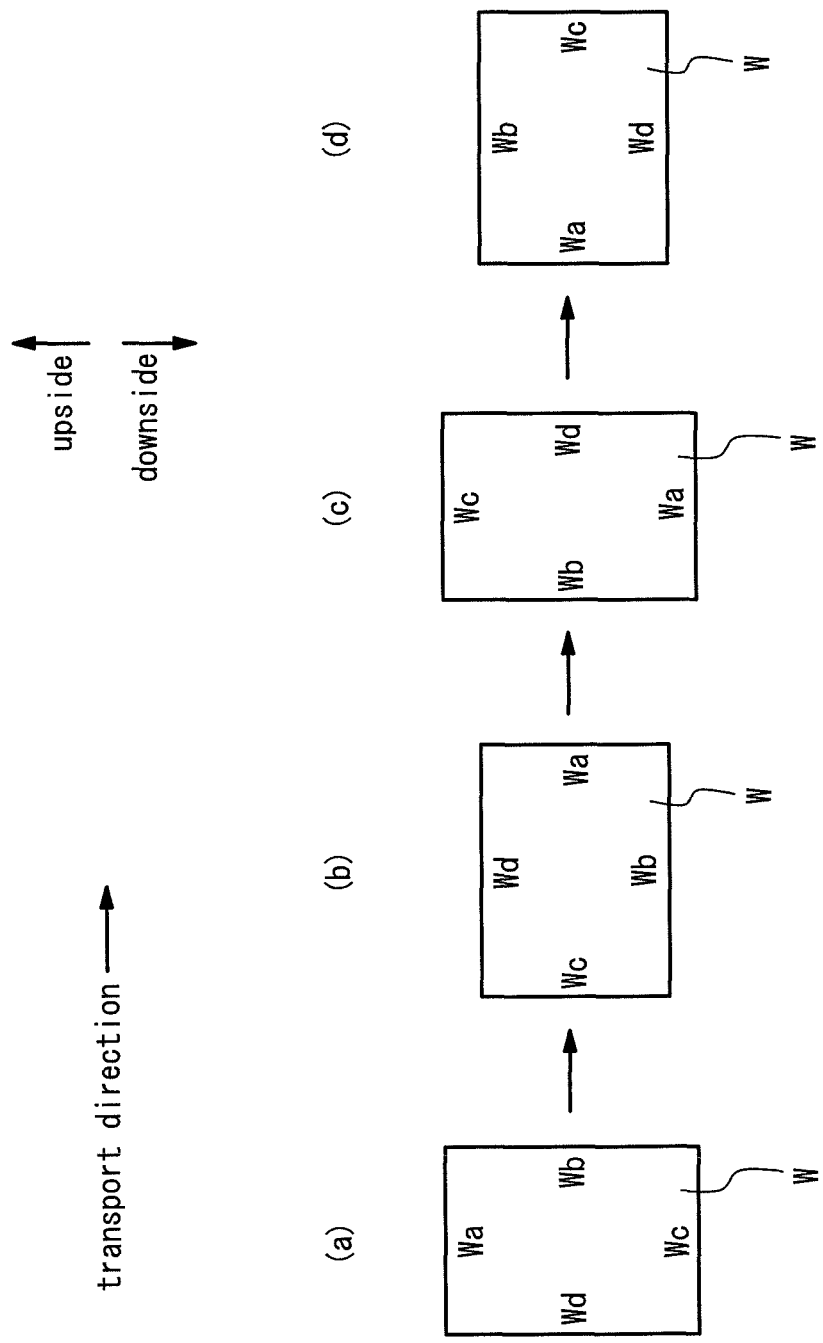
FIG. 18 is a drawing illustrated to describe a plating method performed for a work having a planar shape by using the plating apparatus according to another embodiment.

Condition j: within the scope of the Invention
  substrate posture: vertical
  whether plating solution is sprayed: sprayed
  spray angle of plating solution: tilting through +60 to +45° or −60 to −45° relative to perpendicular line of work surface
  whether air bubbles are sprayed: not sprayed
  whether plating solution spray angle is adjusted: not adjusted
  whether substrate posture is adjusted: adjusted:
  method of adjusting substrate posture: rotate the planar-shape work W through 90 degrees at a time point when ¼ of plating time passed Under the condition j, the metal is precipitated from the plating solution P by electroless plating or electroplating while the plating solution P is being sprayed onto the planar-shape work W, so that the through hole of the planar-shape work W is filled with the precipitated metal. At a time point while the through hole is being filled with the metal, the posture of the planar-shape work W is changed. More specifically, the spray angle at which the plating solution P is sprayed onto the planar-shape work W is set to a spray angle θ non-perpendicular to the perpendicular line of the planar-shape work W toward one side as illustrated in FIG. 8A. At the set angle, the plating solution P is sprayed. In the illustration of FIG. 18 (a), an end Wa of the planar-shape work W is located on the upper side, an end Wb is located on the right side, an end Wc is located on the lower side, and an end Wd is located on the left side. At a time point during the plating treatment, the spray angle θ of the plating solution P remains unchanged hut the posture of the planar-shape work W is rotated by the work rotators 110 through 90 degrees so that the end Wa of the planar-shape work W is located on the right side, the end Wb is located on the lower side, the end Wc is located on the left side, and the end Wd is located on the upper side as illustrated in FIG. 18 (b). Then, the plating solution P is sprayed onto the work W thus rotated at the spray angle θ. At a time point during the plating treatment, the spray angle θ of the plating solution P remains unchanged but the posture of the planar-shape work W is further rotated by the work rotators 110 through 90 degrees so that the end Wa of the planar-shape work W is located on the lower side, the end Wb is located on the left side, the end Wc is located on the upper side, and the end Wd is located on the right side as illustrated in FIG. 18 (*c*). Then, the plating solution P is sprayed onto the work W thus rotated at the spray angle θ. At a time point during the plating treatment, the spray angle θ of the plating solution P remains unchanged but the posture of the planar-shape work W is further rotated by the work rotators 110 through 90 degrees so that the end Wa of the planar-shape work W is located on the left side, the end Wb is located on the upper side, the end Wc is located on the right side, and the end Wd is located on the lower side as illustrated in FIG. 18 (*d*). Then, the plating solution P is sprayed onto the work W thus rotated at the spray angle θ. After the plating treatment is over, the posture of the planar-shape work W is further rotated by the work rotators 110 through 90 degrees so that the end Wa of the planar-shape work W is located on the upper side, the end Wb is located on the right side, the end Wc is located on the lower side, and the end Wd is located on the left side as illustrated in FIG. 18 (*a*). Under the same plating condition, lengths of plating time before and after changing the posture of the planar-shape work W (rotation of the planar-shape work W) are preferably ¼ or substantially ¼ of an overall plating time, respectively.

EXAMPLE 6

In an example 6, the through hole h of the planar-shape work W was subjected to the plating treatment under the following condition to be filled with the pure metal q. As a result, the through hole was favorably filled with the pure metal q with neither voids nor seams as illustrated in FIG. 11.

condition: j
current density (A/dm$^2$): 1.5
required time for plating: 80 minutes

The invention claimed is:

1. A plating method comprising filling a through hole of a printed board with a metal precipitated from a plating solution while the printed board is plated in the plating solution by either one of electroless plating and electroplating, wherein the plating solution contains (a) an inhibitor which inhibits growth of plating film, is of larger molecular weight and is more likely to reach portions of the printed board where agitation of the plating solution is stronger and (b) an accelerator which accelerates growth of plating film, is of smaller molecular weight and is more likely to reach portions of the printed board where agitation of the plating solution is weaker and wherein the method is carried out by the following steps in the following order consisting essentially of:

(1) a first step of conveying the printed board in a conveying direction in a horizontal plane or a vertical plane while the printed board is dipped in a plating bath containing therein the plating solution;

(2) a second step of aligning a plurality of spray nozzles at equal intervals in two rows along the conveying direction of the printed board, each of the rows of spray nozzles being spaced the same distance to each other from a respective opposed surface of the printed board;

(3) a third step of setting a spray angle of the plating solution from the plurality of spray nozzles to be changeable from a first spray angle, the first spray angle being fixed and being non-perpendicular in the conveying direction relative to a line perpendicular to the surfaces of the printed board, to a second spray angle, the second spray angle being fixed and being non-perpendicular in a direction opposite the conveying direction relative to the line perpendicular to the surfaces of the printed board, the second spray angle being the same angle as the first spray angle in absolute values;

(4) a fourth step of partially filing the through hole of the printed board with the metal precipitated from the plating solution by spraying the plating solution relative to the printed board from the plurality of spray nozzles being arranged to the first spray angle while conveying in the conveying direction the printed board dipped in the plating bath, the first spray angle of each of the plurality of the spray nozzles being all the same angle and the plating solution flowing on the printed board in a first direction, the first direction being a direction toward which the nozzles set at the first spray angle are inclined;

(5) a fifth step of continuing to fill the through hole of the printed board with the metal precipitated from the plating solution by spraying the plating solution relative to the printed board from the plurality of spray nozzles being arranged to the second spray angle at a time during the fourth step, the second spray angle of each of the plurality of the spray nozzles being all the same angle and the plating solution flowing on the printed board in a second direction, the second direction being a direction toward which the nozzles set at the second spray angle are inclined; and (6) a sixth step of controlling a plating processing time so that the plating process time before and after changing the spray angle, during the third step, is substantially the same and the sum of said substantially the same times is total plating time, wherein the first and second angle are selected so that agitation of the plating solution is strongest in a vicinity of each of openings of the through hole at the respective opposed surfaces and weakens with depth in the through hole toward a region of the through hole midway of the openings so that at the midway region agitation of the plating solution is weakest and, moreover, agitation in the midway region is weaker on a wall portion of the through hole downstream of the flow of the plating solution on the printed board than on a wall portion of the through hole upstream of the flow of the plating solution on the printed board so that a plating comprising an annular bulge of precipitated metal being thickest midway of the through hole openings is formed in each of the fourth step and fifth step more rapidly on said downstream wall portions of the through hole than on said upstream wall portions thereby forming a symmetrical annular plating in the through hole which plating bulges in the middle region and flares outwardly toward each of the openings and grows in thickness during the plating process so that the through hole is filled with the precipitated metal consecutively upwards from midway of the through hole to plating being formed on the respective opposed surfaces of the printed board whereby the holes are filled without seams or voids.

2. The plating method of claim 1, further comprising: changing an orientation of the printed board during either one or both of the fourth step and the fifth step.

3. The plating method as in claim 1 or 2, wherein the plating solution is copper sulfate plating solution.

4. The plating method of claim 1, wherein the first and second spray angles are each a same fixed angle in a range of 30° to 80°.

* * * * *